United States Patent
Park et al.

(10) Patent No.: US 9,337,057 B2
(45) Date of Patent: May 10, 2016

(54) SEMICONDUCTOR DEVICE AND METHOD FOR FABRICATING THE SAME

(71) Applicants: Moon-Kyu Park, Hwaseong-si (KR); Oh-Seong Kwon, Hwaseong-si (KR); Sung-Kee Han, Seoul (KR); Sang-Jin Hyun, Suwon-si (KR)

(72) Inventors: Moon-Kyu Park, Hwaseong-si (KR); Oh-Seong Kwon, Hwaseong-si (KR); Sung-Kee Han, Seoul (KR); Sang-Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/802,467

(22) Filed: Jul. 17, 2015

(65) Prior Publication Data

US 2016/0020118 A1 Jan. 21, 2016

(30) Foreign Application Priority Data

Jul. 21, 2014 (KR) .................. 10-2014-0091910

(51) Int. Cl.
*H01L 21/3215* (2006.01)
*H01L 29/40* (2006.01)
*H01L 21/28* (2006.01)

(52) U.S. Cl.
CPC ...... *H01L 21/3215* (2013.01); *H01L 21/28088* (2013.01); *H01L 29/401* (2013.01)

(58) Field of Classification Search
CPC ............ H01L 21/28088; H01L 21/321; H01L 21/3215; H01L 29/401
See application file for complete search history.

(56) References Cited

U.S. PATENT DOCUMENTS

| | | | |
|---|---|---|---|
| 5,654,242 A | 8/1997 | Komatsu | |
| 7,326,631 B2 | 2/2008 | Lander et al. | |
| 7,960,802 B2 | 6/2011 | Niimi et al. | |
| 8,399,344 B2 | 3/2013 | Pierreux et al. | |
| 2007/0272967 A1 | 11/2007 | Pantisano et al. | |
| 2010/0038725 A1 | 2/2010 | Chudzik et al. | |
| 2010/0109095 A1 | 5/2010 | Li et al. | |
| 2010/0155860 A1* | 6/2010 | Colombo | .......... H01L 21/28079 257/412 |
| 2012/0292715 A1 | 11/2012 | Hong et al. | |
| 2012/0309181 A1 | 12/2012 | Machkaoutsan et al. | |
| 2013/0105901 A1 | 5/2013 | Park et al. | |
| 2013/0234254 A1 | 9/2013 | Ng et al. | |
| 2013/0270647 A1 | 10/2013 | Zhu et al. | |

FOREIGN PATENT DOCUMENTS

| | | |
|---|---|---|
| JP | 2012-124215 | 6/2012 |
| KR | 1020030048214 | 6/2003 |

* cited by examiner

*Primary Examiner* — Daniel Shook
(74) *Attorney, Agent, or Firm* — Myers Bigel & Sibley, P.A.

(57) ABSTRACT

Provided are methods for fabricating semiconductor devices. The methods for fabricating the semiconductor devices may include forming a first interlayer insulation film including a trench on a substrate, forming a high-k layer along an inner sidewall and a bottom surface of the trench, forming a first work function control film including impurities along the high-k layer, removing the impurities from the first work function control film to reduce surface resistance of the first work function control film by about 30% to about 60% and forming a gate metal in the trench.

20 Claims, 30 Drawing Sheets

SEMICONDUCTOR DEVICE AND METHOD FOR FABRICATING THE SAME

CROSS-REFERENCE TO RELATED APPLICATION

This application claims priority under 35 U.S.C. §119 to Korean Patent Application No. 10-2014-0091910 filed on Jul. 21, 2014 in the Korean Intellectual Property Office, the disclosure of which is hereby incorporated by reference in its entirety.

BACKGROUND

1. Field of the Inventive Concept

The present inventive concept relates to methods for fabricating semiconductor device.

2. Description of the Related Art

As a size of a metal oxide semiconductor (MOS) transistor has been reduced, a length of a gate and a length of a channel in the MOS transistor are also gradually decreasing. Accordingly, various studies have been done to increase capacitance between the gate and the channel and to improve operating characteristics of the MOS transistor.

Metal-oxide-semiconductor (MOS) transistors using a polysilicon gate electrode are widely known. Since polysilicon is capable of withstanding well at a higher temperature than most metals, it may be annealed at a high temperature with a source and drain region. In addition, since polysilicon may reduce implanting of doped atoms into a channel region, a self-aligned source and drain structure may be formed after a gate patterning process.

Polysilicon has higher resistance than most metals, and a polysilicon gate electrode operates at a lower speed than a metal gate electrode. One of the methods for compensating for high resistance of polysilicon is replacing the polysilicon gate electrode with a metal gate electrode using a replacement metal gate (RMG) process. A high-temperature process is performed while polysilicon gates remain on a semiconductor substrate, and the polysilicon gates are removed after performing the high-temperature process to be replaced by metal gates, thereby forming a replacement metal gate (RMG).

SUMMARY

The present inventive concept provides a method for fabricating a semiconductor device, which can adjust a work function of a gate electrode.

The above and other objects of the present inventive concept will be described in or be apparent from the following description of the preferred embodiments.

A method for fabricating a semiconductor device may include forming a first interlayer insulation film including a trench on a substrate, forming a high-k layer along an inner sidewall and a bottom surface of the trench, forming a first work function control film including impurities along the high-k layer, at least partially removing the impurities from the first work function control film to reduce surface resistance of the first work function control film by about 30% to about 60% and forming a gate metal in the trench.

In various embodiments, removing the impurities may include removing the impurities by doping hydrogen into the first work function control film using hydrogen plasma.

According to various embodiments, the impurities may include oxygen (O).

According to various embodiments, the first work function control film may include a material having lower electronegativity than the impurities.

According to various embodiments, a concentration of the impurities in the first work function control film may be reduced by up to about 90% by doping hydrogen into the first work function control film.

In various embodiments, the impurities may include first impurities and second impurities different from the first impurities, and a concentration of the second impurities in the first work function control film may be reduced by up to about 80% by doping hydrogen into the first work function control film.

According to various embodiments, the first impurities may include oxygen (O) and the second impurities may include chlorine (Cl).

In various embodiments, doping hydrogen into the first work function control film may include doping hydrogen at a pressure of about 5 to about 100 mTorr.

In various embodiments, doping hydrogen into the first work function control film may include doping hydrogen by applying a voltage of about 0.1 kV to about 2 kV to the substrate.

According to Various embodiments, the method may further include forming a first barrier layer along the first work function control film, after removing the impurities.

According to various embodiments, the method may further include forming a capping layer on the trench, after forming the gate metal.

In various embodiments, the method may also include forming a second interlayer insulation film on the capping layer after forming the capping layer. The capping layer may be between the first work function control film and the second interlayer insulation film such that the first work function control film does not contact the second interlayer insulation film.

According to various embodiments, the method may further include forming a second work function control film different from the first work function control film along the first work function control film, before forming the gate metal.

In various embodiments, the first work function control film may include a P-type work function control film, and the second work function control film may include an N-type work function control film.

In various embodiments, the method may also include forming an interface layer on the substrate in the trench, before forming the high-k layer.

In various embodiments, the method may also include forming a fin shaped pattern protruding on the substrate before forming the first interlayer insulation film. The trench may expose a top portion of the fin shaped pattern.

According to various embodiments, the method may additionally include forming a dummy gate structure before forming the first interlayer insulation film. Forming the first interlayer insulation film may include forming the first interlayer insulation film on sidewalls of the dummy gate structure and removing the dummy gate structure to form the trench.

A method for fabricating a semiconductor device may include forming a fin shaped pattern protruding on a substrate that includes a first region and a second region, forming a dummy gate structure crossing the fin shaped pattern, forming a source/drain region at a side of the dummy gate structure, forming a trench exposing a top portion of the fin shaped pattern by removing the dummy gate structure, forming a high-k layer in the trench, forming a first work function control film including first impurities on the high-k layer, doping hydrogen into the first work function control film using hydrogen plasma to remove about up to 90% of the first impurities from the first work function control film and forming a gate metal on the first work function control film in the trench.

In various embodiments, the first work function control film may include second impurities different from the first impurities, and the second impurities may be removed by up to about 80% by doping hydrogen into the first work function control film.

In various embodiments, doping hydrogen into the first work function control film may include doping hydrogen at a pressure of about 5 to about 100 mTorr and by applying a voltage of about 0.1 kV to about 2 kV to the substrate.

In various embodiments, the first work function control film may include at least one of TiN, TaN, TiAlN, TaAlN and TiSiN.

In various embodiments, the method may further include, after forming the gate metal, forming a gate structure using a planarization process and forming a capping layer on the gate structure.

According to various embodiments, a flatband voltage of the gate structure may be reduced by doping hydrogen into the first work function control film.

According to various embodiments, surface resistance of the gate structure may be reduced by doping hydrogen into the first work function control film.

In various embodiments, the capping layer may include at least one of SiN, SiON, and SiCON.

According to various embodiments, the first region may include a NFET region, and the second region may include a PFET region.

A method for fabricating a semiconductor device may include providing a substrate including a first region and a second region, forming a first fin shaped pattern protruding on the first region and a second fin shaped pattern protruding on the second region, forming a first dummy gate structure crossing the first fin shaped pattern and a second dummy gate structure crossing the second fin shaped pattern, forming first and second trenches exposing the first and second fins, respectively, by removing the first and second dummy gate structures, forming a high-k layer in the first and second trenches, forming a first work function control film on the high-k layer in the first and second trench, the first work function control film including oxygen, at least partially removing oxygen in the first work function control film by doping hydrogen into the first work function control film using hydrogen plasma, forming a first barrier layer on the first work function control film in the first and second trenches, removing the first barrier layer and the first work function control film in the first trench and forming a second work function control film in the first and second trenches.

In various embodiments, the first work function control film may further include chlorine, and doping hydrogen into the first work function control film may include at least partially removing chorine from the first work function control film.

According to various embodiments, a concentration of oxygen in the first work function control film may be reduced by up to about 90% by doping hydrogen into the first work function control film.

In various embodiments, the first work function control film may include nitride.

A method for forming a semiconductor device may include forming a gate insulating layer on a substrate, forming a work function control film including impurities on the gate insulating layer and doping hydrogen into the work function control film using a hydrogen plasma doping process to remove at least a portion of the impurities from the work function control film.

In various embodiments, the hydrogen plasma doping process may remove up to about 90% of the impurities from the work function control film.

According to various embodiments, the impurities may include oxygen (O).

According to various embodiments, the work function control film may include a material having lower electronegativity than the impurities.

In various embodiments, the impurities may include first impurities and second impurities that may be different from the first impurities. The hydrogen plasma doping process may remove up to about 90% of the first impurities from the work function control film and may remove up to about 80% of the second impurities from the work function control film.

In various embodiments, the first impurities may include oxygen (O) and the second impurities may include chlorine (Cl).

According to various embodiments, the hydrogen plasma doping process may be performed at a pressure of about 5 mTorr to about 100 mTorr and by applying a voltage of about 0.1 kV to about 2 kV to the substrate.

BRIEF DESCRIPTION OF THE DRAWINGS

The present inventive concept will become more apparent with some embodiments thereof and the attached drawings in which.

DETAILED DESCRIPTION

Figure 1:
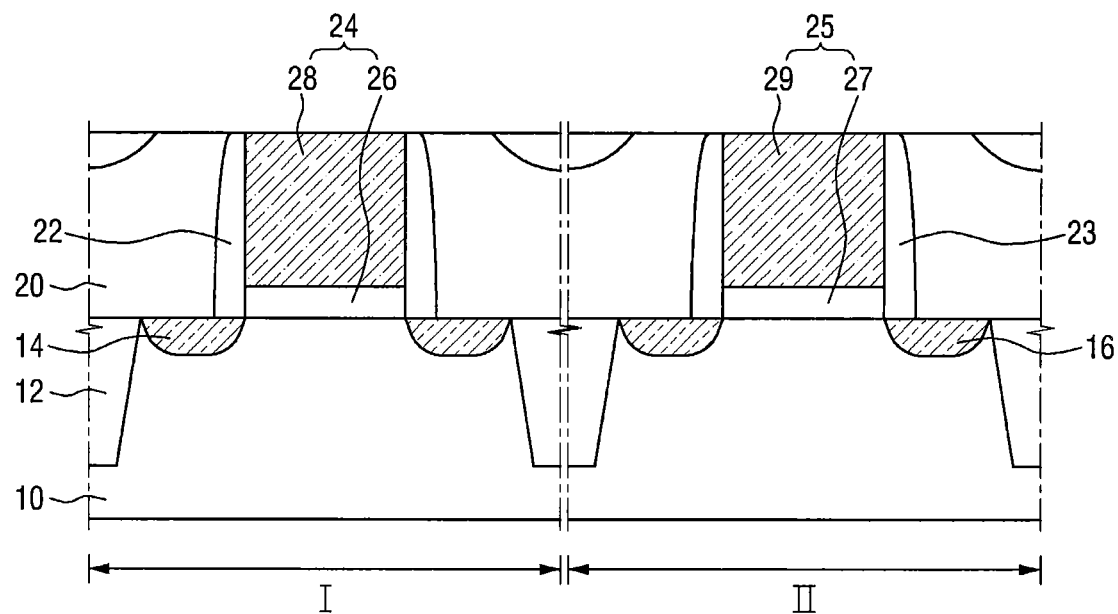
FIGS. 1 to 9 are cross-sectional views for explaining a method for fabricating a semiconductor device according to some embodiments of the present inventive concept.

The present inventive concept may be understood more readily by reference to the following detailed description of some embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the present inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than an abrupt change from an implanted region to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

The cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a method for fabricating a semiconductor device according to some embodiments of the present inventive concept will be described with reference to FIGS. 1 to 9. FIGS. 1 to 9 are cross-sectional views for explaining a method for fabricating a semiconductor device 1 according to some embodiments of the present inventive concept.

Referring to FIG. 1, a substrate 10 is provided. The substrate 10 may include a first region I and a second region II. The first and second regions I and II may be spaced apart from each other or may be connected to each other. For example, the first region I may be an NMOS region where an N-type transistor is formed, and the second region II may be a PMOS region where a P-type transistor is formed, but aspects of the present inventive concept are not limited thereto.

An active region is defined by forming an isolation layer 12, such as a shallow trench isolation (STI) in the substrate 10. The substrate 10 may include at least one semiconductor material selected from the group consisting of Si, Ge, SiGe, GaP, GaAs, SiC, SiGeC, InAs and InP. In addition, the substrate 10 may also be a silicon on insulator (SOI) substrate.

A first dummy gate structure 24 is formed on the first region I and a second dummy gate structure 25 is formed on the second region II. The first and second dummy gate structures 24 and 25 may include first and second dummy gate insulation layers 26 and 27 and first and second dummy gate electrodes 28 and 29, respectively. The first and second dummy gate insulation layers 26 and 27 are formed on the substrate 10 and may be, for example, silicon oxide layers. The first and second dummy gate electrodes 28 and 29 may be formed on the first and second dummy gate insulation layers 26 and 27, respectively. The first and second dummy gate electrodes 28 and 29 may include, for example, polysilicon.

First and second source/drain regions 14 and 16 may be formed on the substrate 10 using the first and second dummy gate structures 24 and 25 as masks. The first source/drain region 14 is formed on the first region I and the second source/drain region 16 is formed on the second region II. The first and second source/drain regions 14 and 16 may be formed on at least one side of the first and second dummy gate structures 24 and 25. In detail, the first source/drain region 14 may be formed between the isolation layer 12 and the first dummy gate structure 24 and the second source/drain region 16 may be formed between the isolation layer 12 and the second dummy gate structure 26. A channel region positioned under the first dummy gate structure 24 may be a region in which N-type carriers contained in the first source/drain region 14 move, and a channel region positioned under the second dummy gate structure 26 may be a region in which P-type carriers contained in the second source/drain region 16 move.

First and second spacers 22 and 23 are formed on sidewalls of the first and second dummy gate structures 24 and 25, respectively. The first and second spacers 22 and 23 may include, for example, silicon oxide or silicon nitride. The first and second spacers 22 and 23 may be formed on the sidewalls of the first dummy gate structure 24 and second dummy gate structure 25 by forming spacer layers using, for example, a CVD process, and etching the spacer layers using, for example, an etch-back process. It will be understood that the shapes of the first and second spacers 22 and 23 are not limited to those illustrated in FIG. 1.

Next, an interlayer insulation film 20 is formed on the substrate 10. The interlayer insulation film 20 may cover the sidewalls of the first and second spacers 22 and 23 while exposing top surfaces of the first and second dummy gate structures 24 and 25. In order to expose the top surfaces of the first and second dummy gate structures 24 and 25, a planarization process may be performed after forming the interlayer insulation film 20. In some embodiments, the interlayer insulation film 20 may include two or more insulation layers staked.

Figure 2:
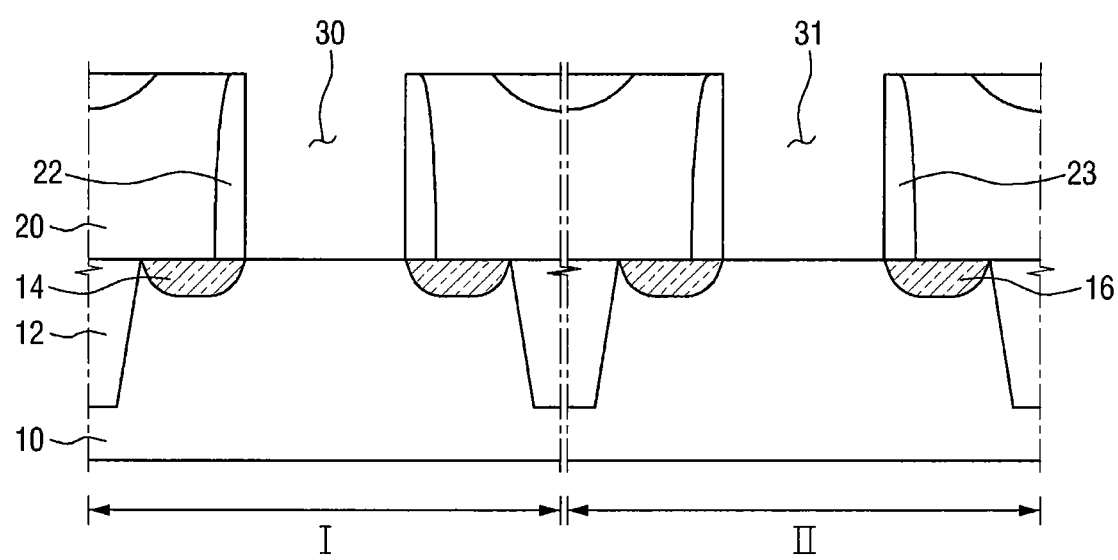

Referring to FIG. 2, the interlayer insulation film 20 may include a first trench 30 formed on the first region I and a second trench 31 formed on the second region II. The first trench 30 may be formed by removing the first dummy gate structure 24 and the second trench 31 may be formed by removing the second dummy gate structure 25.

The first trench 30 may expose sidewalls of the first spacer 22 and a top surface of the substrate 10 and the second trench 31 may expose sidewalls of the second spacer 23 and the top surface of the substrate 10.

Figure 3:
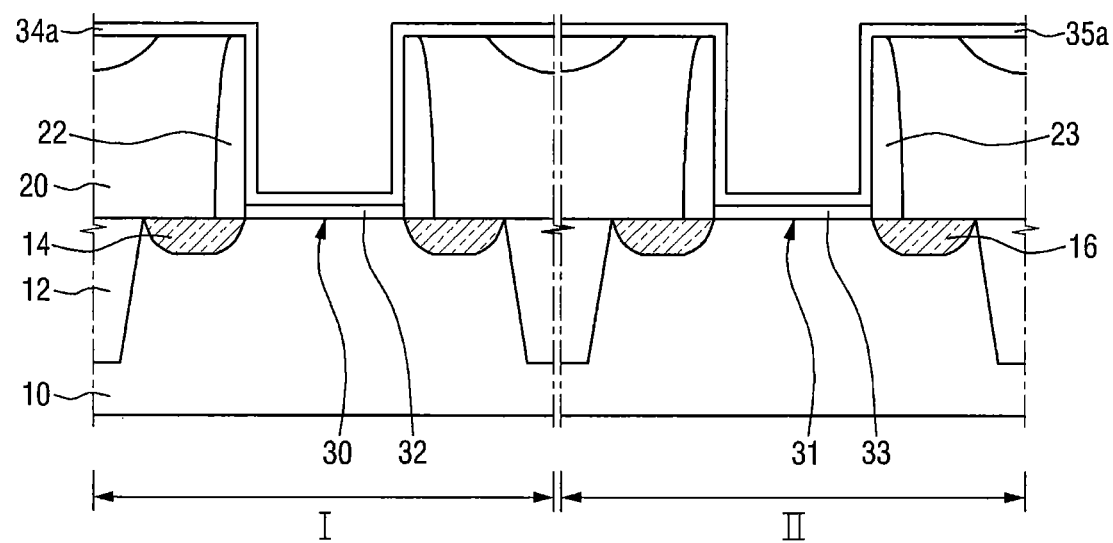

Referring to FIG. 3, a first interface layer 32 may be formed on the top surface of the substrate 10 in the first trench 30 and a second interface layer 33 may be formed on the top surface of the substrate 10 in the second trench 31.

In some embodiments, the first and second interface layers 32 and 33 may be formed by oxidizing the exposed top surface of the substrate 10 in the first and second trenches 30 and 31, but aspects of the present inventive concept are not limited thereto. The first and second interface layers 32 and 33 may be formed along bottom surfaces of the first and second trenches 30 and 31, respectively. The first and second interface layers 32 and 33 may reduce or possibly prevent interface failures (e.g., defects) between the substrate 10 and high-k layers 34a and 35a. The first and second interface layers 32 and 33 may include a low-k material layer having a dielectric constant (k) of about 9 or less, e.g., a silicon oxide layer (dielectric constant k is about 4) or a silicon oxynitride layer (dielectric constant k is about 4 to about 8 according to concentrations of oxygen and nitrogen atoms). In some embodiments, the first and second interface layers 32 and 33 may include silicate or a combination of layers listed above.

Next, high-k layers 34a and 35a may be formed in the first and second trenches 30 and 31, respectively. The high-k layers 34a and 35a may be conformally formed along inner side walls and bottom surfaces of the first and second trenches 30 and 31. The high-k layers 34a and 35a may also be formed on the interlayer insulation film 20. The high-k layers 34a and 35a may include a high-k material having a higher dielectric constant than a silicon oxide layer. For example, the high-k layers 34a and 35a may include a material selected from the group consisting of HfSiON, HfO$_2$, ZrO$_2$, Ta$_2$O$_5$, TiO$_2$, SrTiO$_3$ and (Ba,Sr) TiO$_3$. The high-k layers 34a and 35a may have appropriate thicknesses according to the kind of device to be formed.

Figure 4:
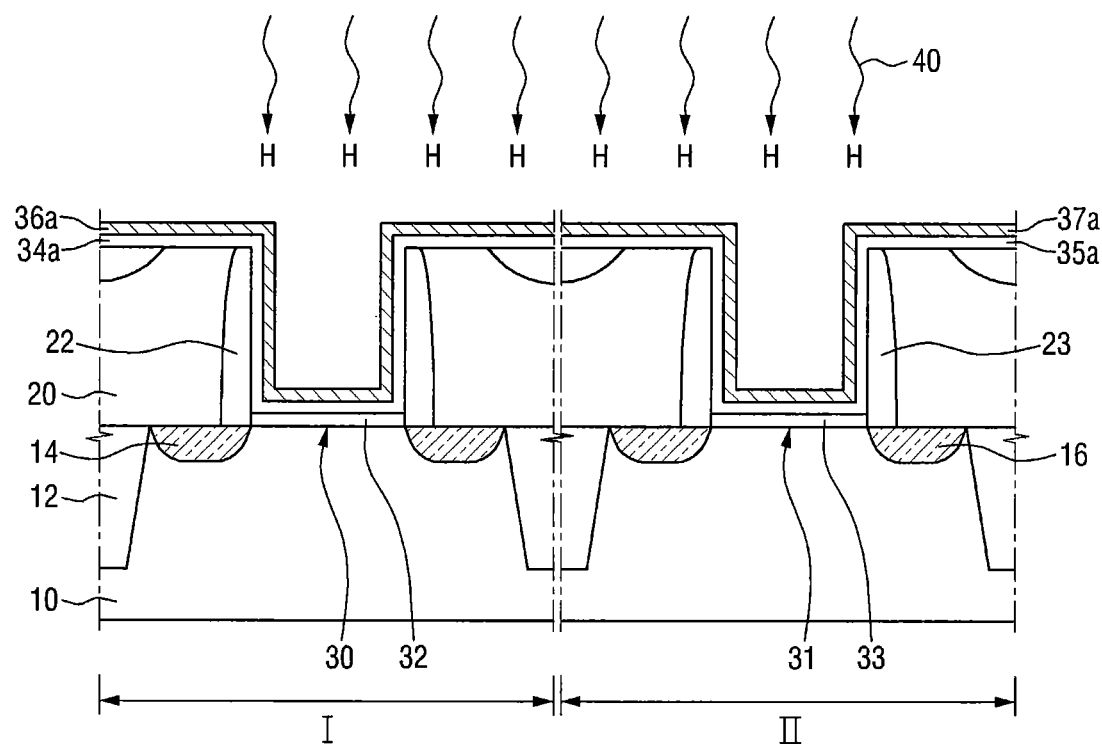

Referring to FIG. 4, first work function control films 36a and 37a are formed on the high-k layers 34a and 35a. The first work function control films 36a and 37a may be formed on the high-k layers 34a and 35a along the inner sidewalls and the bottom surfaces of the first and second trenches 30 and 31.

In other words, the first work function control films 36a and 37a may be conformally formed along the high-k layers 34a and 35a.

The first work function control films 36a and 37a may be P-type work function control films and may include, for example, at least one nitride layer that include TiN, TaN, TiAlN, TaAlN, or TiSiN.

Meanwhile, the first work function control films 36a and 37a may include impurities. The impurities may include first impurities and second impurities. The first impurities may be oxygen (O) and the second impurities may be chlorine (Cl). It will be understood that, when the first work function control films 36a and 37a are formed, the first work function control films 36a and 37a may be oxidized. Further, it will be understood that the pre-oxidized first work function control films 36a and 37a may be formed on the high-k layers 34a and 35a. In addition, the processing chamber may be provided with the stream of chlorine (Cl), which may penetrate into the first work function control films 36a and 37a in the course of forming the first work function control films 36a and 37a. In such a manner, the first work function control films 36a and 37a may include impurities, which may affect a work function of a gate structure (53 of FIG. 9).

Referring to FIG. 4, the impurities are removed from the first work function control films 36a and 37a. For example, hydrogen plasma 40 (e.g., hydrogen ions) may be doped into the first work function control films 36a and 37a using a doping process. In order to efficiently perform the doping of the hydrogen plasma 40, a voltage of 0.1 kV to 2 kV may be applied to the substrate 10, and the hydrogen plasma 40 may be doped at a process pressure of about 5 to about 100 mTorr. In some embodiments, the hydrogen ions may be doped using a hydrogen plasma doping method.

For example, the hydrogen plasma 40 (e.g., hydrogen ions) may be bonded with the first impurities to form H$_2$O and may be bonded with the second impurities to form HCl. As described above, the hydrogen plasma may react with the impurities to remove the impurities from the first work function control films 36a and 37a.

The concentration of the first impurity contained in the first work function control films 36a and 37a may be reduced by greater than 0% and up to about 90% by the doping of the hydrogen plasma (40), and the concentration of the second impurity contained in the first work function control films 36a and 37a may be reduced by greater than 0% and up to about 80%.

Figure 5:
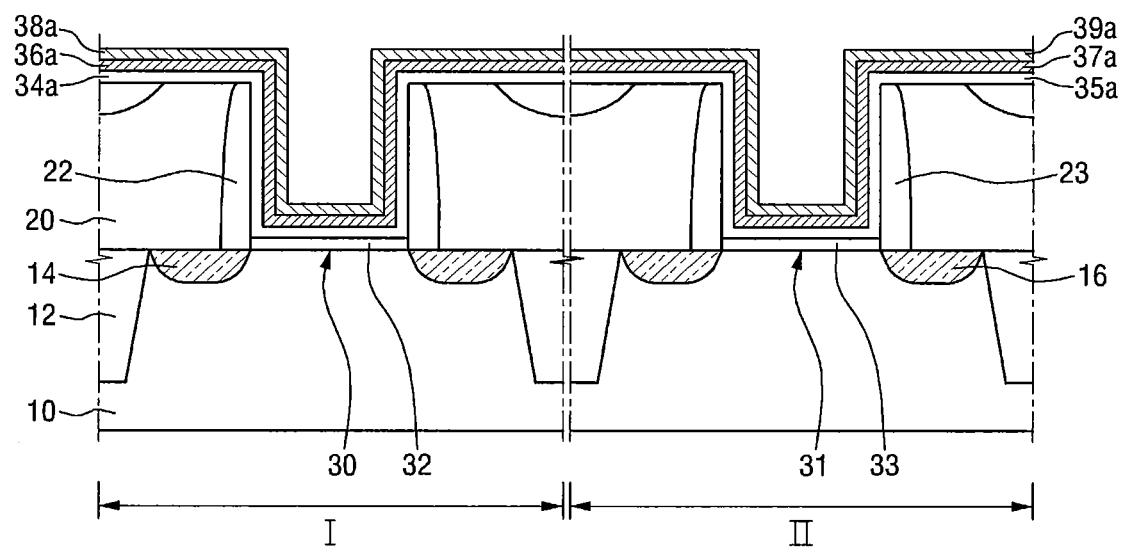

Referring to FIG. 5, first barrier layers 38a and 39a may be conformally formed along first work function control films 36a and 37a on the first work function control films 36a and 37a. The first barrier layers 38a and 39a may be conformally formed along inner sidewalls and bottom surfaces of the first and second trenches 30 and 31.

After the doping of the hydrogen plasma (40), the first barrier layers 38a and 39a are formed, thereby possibly preventing the impurities from penetrating into the first work function control films 36a and 37a.

The first barrier layers 38a and 39a may include, for example, at least one of TiN, TaN, TiAlN, TaAlN, TaAlN and TiSiN.

Figure 6:
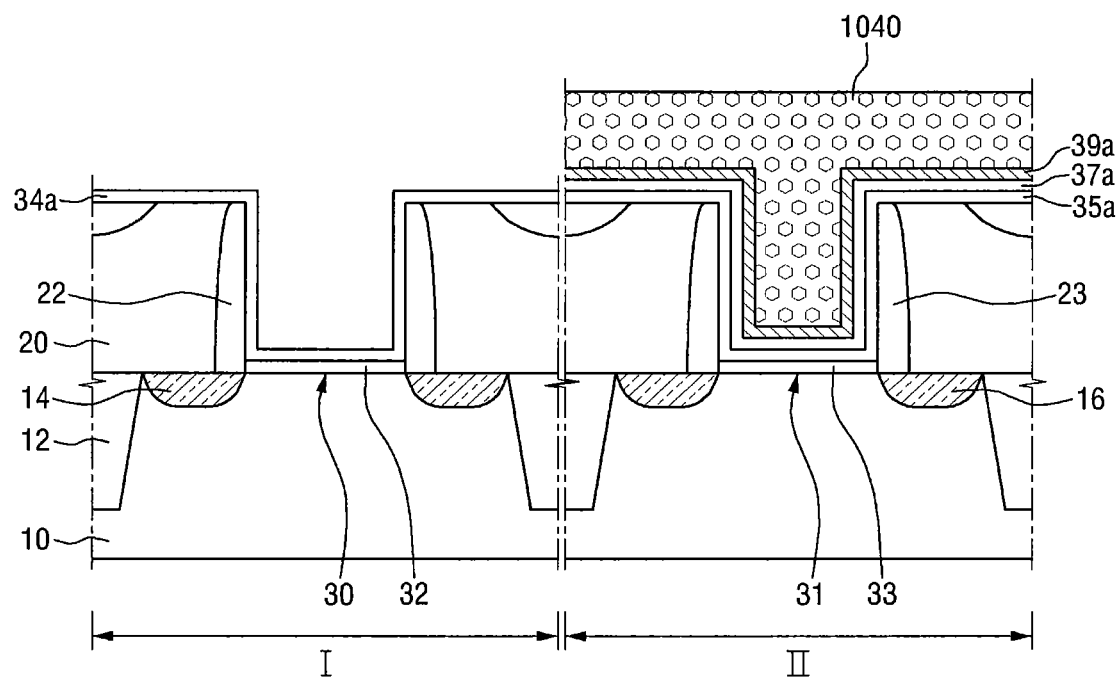

Referring to FIG. 6, a mask 1040 may be formed on the first barrier layer 39a of the second region II. The mask 1040 may cover the second trench 31 while exposing the first trench 30.

Next, the first barrier layer 38a and the first work function control film 36a in the first region I may be removed using the mask 1040 as a mask. Accordingly, the first high-k layer 34a may be exposed.

Next, after removing the first barrier layer 38a and the first work function control film 36a in the first region I, the mask 1040 in the second region II may be removed.

Figure 7:
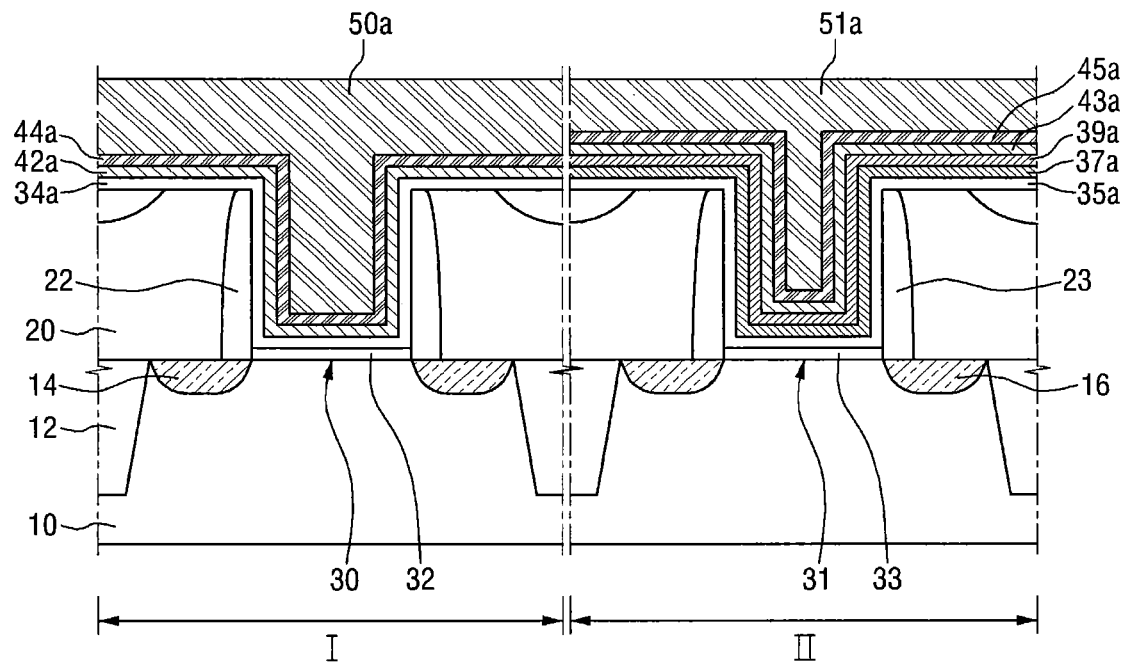

Referring to FIG. 7, second work function control films 42a and 43a may be formed on the first region I and the second region II, respectively. The second work function control films 42a and 43a may be conformally formed along inner sidewalls and bottom surfaces of the first and second trenches 30 and 31. The second work function control film 42a may be formed on the high-k layer 34a in the first region I and the second work function control film 43a may be formed on the first barrier layer 39a in the second region II.

The second work function control films 42a and 43a may be N-type work function control films and may include, for example, at least one of TiAlC, TiAlN, TiAlC—N, TiAl, TaC and TiC.

The second work function control film 43a may be stacked on the first work function control film 37a in the second region II, so that two work function control films may be disposed in the second region II. The underlying first work function control film 37a may control a work function of a transistor, thereby controlling operating characteristics of the transistor. Therefore, the transistor of the second region II may function as a P-type transistor. A transistor of the first region I may function as an N-type transistor by the second work function control film 42a.

Next, second barrier layers 44a and 45a may be conformally formed on and along the second work function control films 42a and 43a. The second barrier layers 44a and 45a may be formed along sidewalls and bottom surfaces of the first and second trenches 30 and 31, respectively.

The second barrier layers 44a and 45a may include, for example, at least one of TiN, TaN, TiAlN, TaAlN, TaAlN, and TiSiN.

Next, gate metals 50a and 51a may be formed on the second barrier layers 44a and 45a. The gate metals 50a and 51a may be formed in the first and second trenches 30 and 31. In some embodiments, the gate metals 50a and 51a may fill the first and second trenches 30 and 31.

The gate metals 50a and 51a may include, for example, aluminum (Al) and/or tungsten (W).

Figure 8:
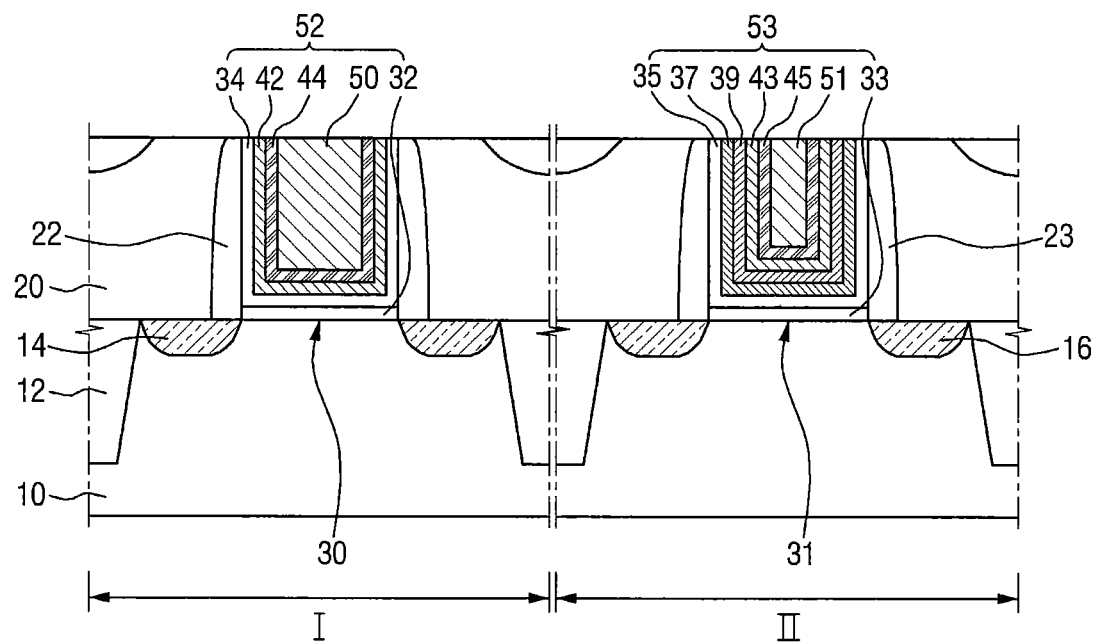

Referring to FIG. 8, first and second gate structures 52 and 53 may be formed. For example, a planarization process may be performed to expose the interlayer insulation film 20, thereby forming a first gate structure 52 in the first region I and a second gate structure 53 in the second region II, respectively. The first gate structure 52 may include a first interface layer 32, a high-k layer 34, a second work function control film 42, a second barrier layer 44 and a gate metal 50, and the second gate structure 53 may include a second interface layer 33, a high-k layer 35, a first work function control film 37, a first barrier layer 39, a second work function control film 43, a second barrier layer 45 and a gate metal 51. The high-k layers 34 and 35, the first work function control film 37, the first barrier layer 39, the second work function control films 42 and 43, and the second barrier layers 44 and 45 may be formed in the first and second trenches 30 and 31 as illustrated in FIG. 8.

Figure 9:
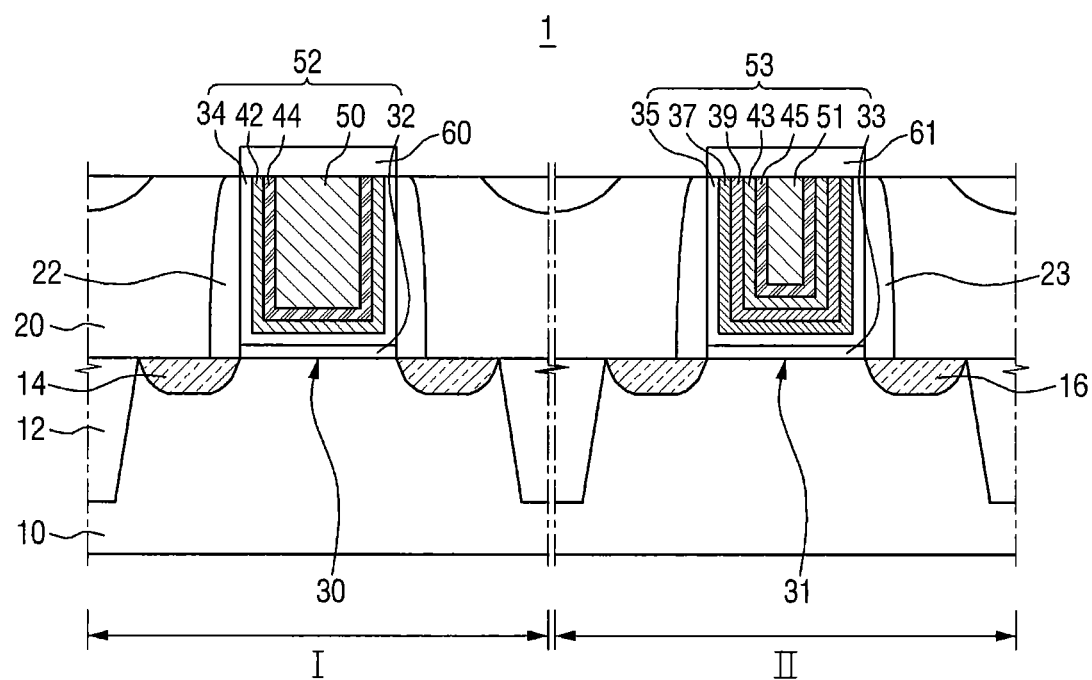

Referring to FIG. 9, first capping layers 60 and 61 may be formed on the first and second gate structures 52 and 53, respectively. The first capping layers 60 and 61 may cover the first and second trenches 30 and 31. The first capping layers 60 and 61 may include a nitride layer (for example, at least one of SiN, SiON and SiCON) or an oxide layer.

The first capping layers 60 and 61 may protect the first and second gate structures 52 and 53 so as to reduce or possibly avoid a change in performance of the first and second gate structures 52 and 53. The first capping layer 61 may cover the first work function control film 37 and thus may possibly prevent impurities from penetrating into the first work function control film 37.

Next, effects of methods according to some embodiments of the present inventive concept will be described with reference to FIGS. 10 and 11.

Figure 10:
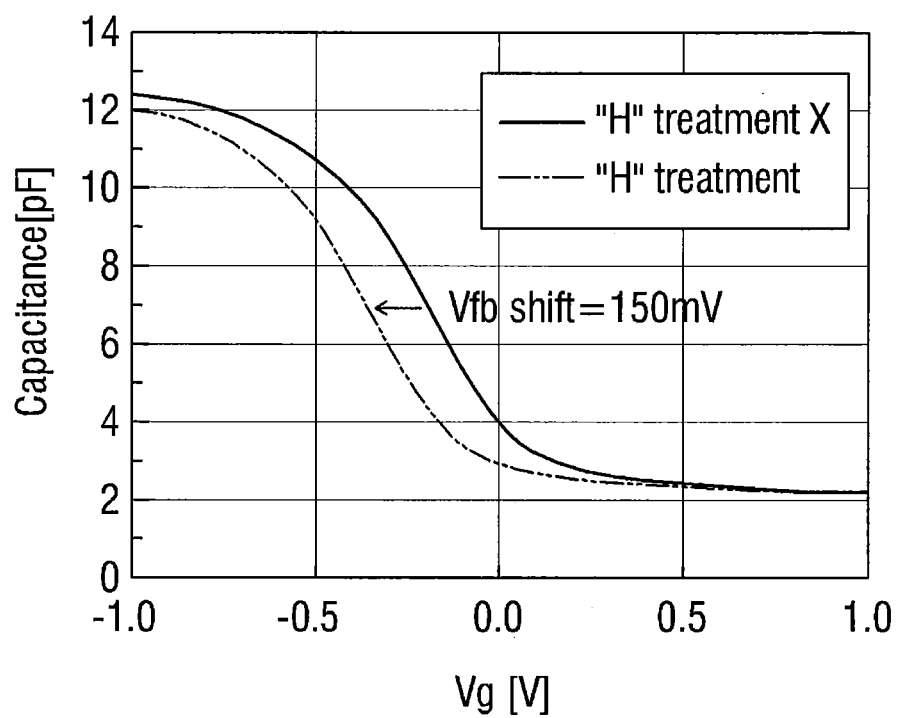
FIGS. 10 and 11 are diagrams for explaining effects of methods according to some embodiments of the present inventive concept.
Figure 11:
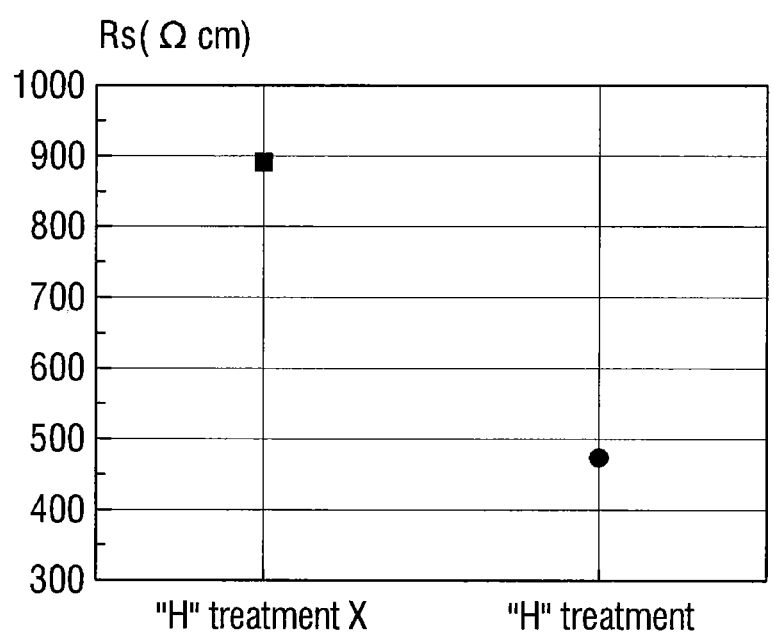

FIGS. 10 and 11 are diagrams for explaining effects of the methods according to some embodiments of the present inventive concept.

FIG. 10 is a graph illustrating capacitance and voltage of the second gate structure 53 of the second region II in the semiconductor device 1 of FIG. 9. In detail, FIG. 10 illustrates a flatband voltage (Vfb) of the second gate structure 53. The solid line of FIG. 10 represents a flatband voltage (Vfb) of the second gate structure 53 when a hydrogen treatment (e.g., doping of hydrogen plasma) is not performed, and the dot-dot-dashed line of FIG. 10 represents a flatband voltage (Vfb) of the second gate structure 53 when a hydrogen treatment (e.g., doping of hydrogen plasma) is performed.

In a case where the doping of the hydrogen plasma (40) is performed, the first work function control film 37 includes a smaller quantity of impurities than in a case where the doping of the hydrogen plasma (40) is not performed. As appreciated by the present inventors, the first impurities may have higher electronegativity than nitrogen (N) that is contained in the first work function control film 37, and thus the first impurities may increase a work function of the second gate structure 53. When the first impurities are removed by the doping of the hydrogen plasma (40), the work function of the second gate structure 53 may be reduced and the flatband voltage (Vfb) may also be reduced. As the result, as shown in FIG. 10, the flatband voltage Vfb was reduced by 150 mV by doping the hydrogen plasma. The quantity of the first impurities removed may be adjusted by changing a process time, a pressure and a magnitude of voltage applied to the substrate 10 during the doping of the hydrogen plasma (40), and a decreasing rate of the flatband voltage may be adjusted.

FIG. 11 is a graph illustrating surface resistance of the gate structure 53 of the second region II in the semiconductor device 1 of FIG. 9.

In a case where the doping of the hydrogen plasma (40) is performed, the first work function control film 37 may include a smaller quantity of impurities than in a case where the doping of the hydrogen plasma (40) is not performed. The smaller the quantity of impurities, the lower the surface resistance of the second gate structure 53. If the impurities are removed by the doping of the hydrogen plasma (40), the surface resistance of the first work function control film 37 may be reduced by approximately 30% to 60%. Accordingly, the surface resistance of the second gate structure 53 may also be reduced by approximately 30% to 60%.

For example, as shown in FIG. 11, the surface resistance of the second gate structure 53 was reduced by 40%, but aspects of the present inventive concept are not limited thereto. The quantity of impurities removed may be adjusted by changing a process time, a pressure and a magnitude of voltage applied to the substrate 10 during the doping of the hydrogen plasma (40), and a decreasing rate of the surface resistance of the second gate structure 53 may be adjusted.

The work function and surface resistance of the second gate structure 53 may be adjusted while reducing a pitch and a driving voltage of a transistor. According to the present inventive concept, the work function and surface resistance of the second gate structure 53 may be adjusted by adjusting the quantity of impurities contained in the first work function control film 37.

A method for fabricating a semiconductor device (2) according to some embodiments of the present inventive concept will now be described with reference to FIGS. 1 to 8 and 12.

Figure 12:
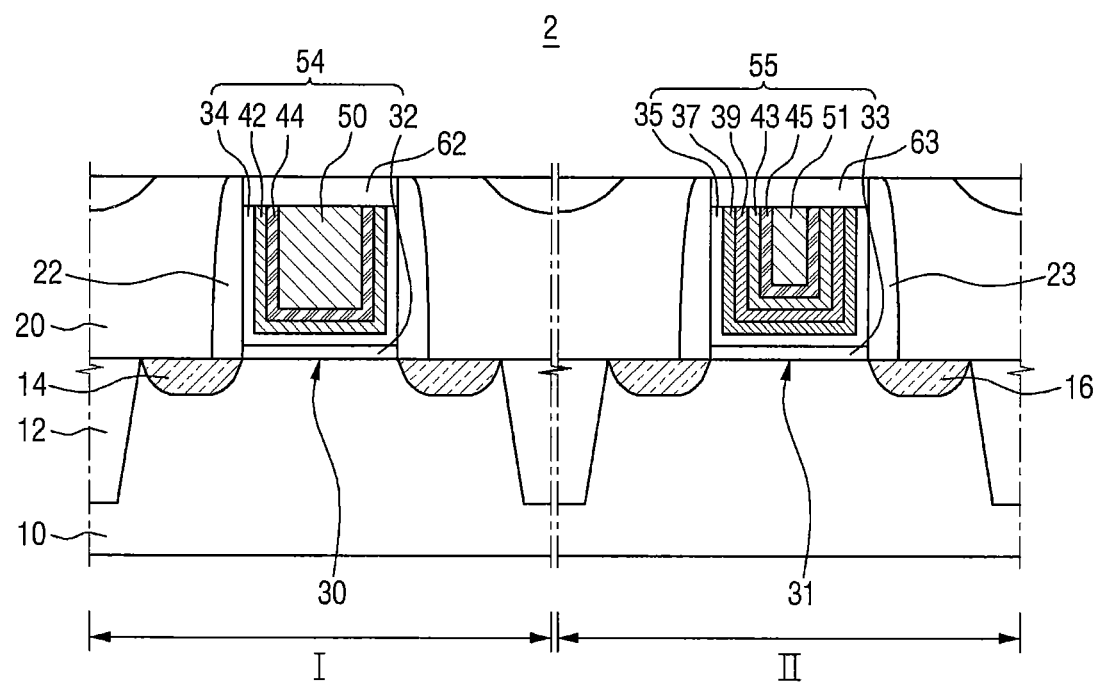
FIG. 12 is a cross-sectional view for explaining a method for fabricating a semiconductor device according to some embodiments of the present inventive concept.

FIG. 12 is a cross-sectional view for explaining a method for fabricating a semiconductor device according to some embodiments of the present inventive concept.

Since FIGS. 1 to 8 have been described above, descriptions thereof will be omitted.

Referring to FIG. 12, portions of the first and second gate structures 52 and 53 may be removed to adjust heights of the first and second gate structures 52 and 53. Therefore, the high-k layers 34 and 35, the first work function control film 37, the first barrier layer 39, the second work function control films 42 and 43, the second barrier layers 44 and 45 and the gate metals 50 and 51, which are provided in the first and second trenches 30 and 31, may be partially removed.

Next, second capping layers 62 and 63 are formed. Sidewalls of the second capping layers 62 and 63 may contact sidewalls of the first and second spacers 22 and 23. In addition, top surfaces of the second capping layers 62 and 63 may be coplanar with the interlayer insulation film 20.

The second capping layers 62 and 63 may include a nitride layer (for example, at least one of SiN, SiON and SiCON) and/or an oxide layer.

Threshold voltages of the first and second gate structures 52 and 53 may be adjusted by adjusting heights of the first and second gate structures 52 and 53.

A method for fabricating a semiconductor device according to some embodiments of the present inventive concept will now be described with reference to FIGS. 13 to 30.

Figure 28:
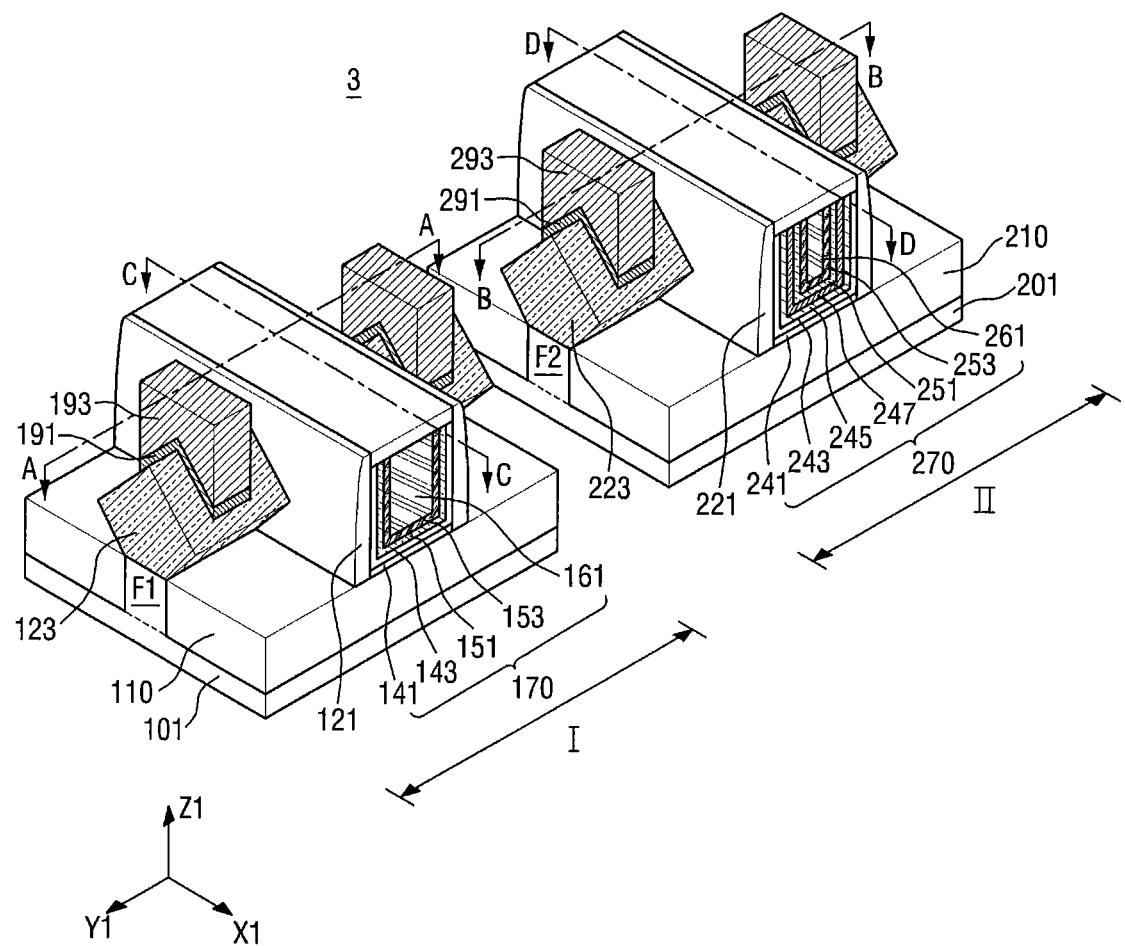
Figure 29:
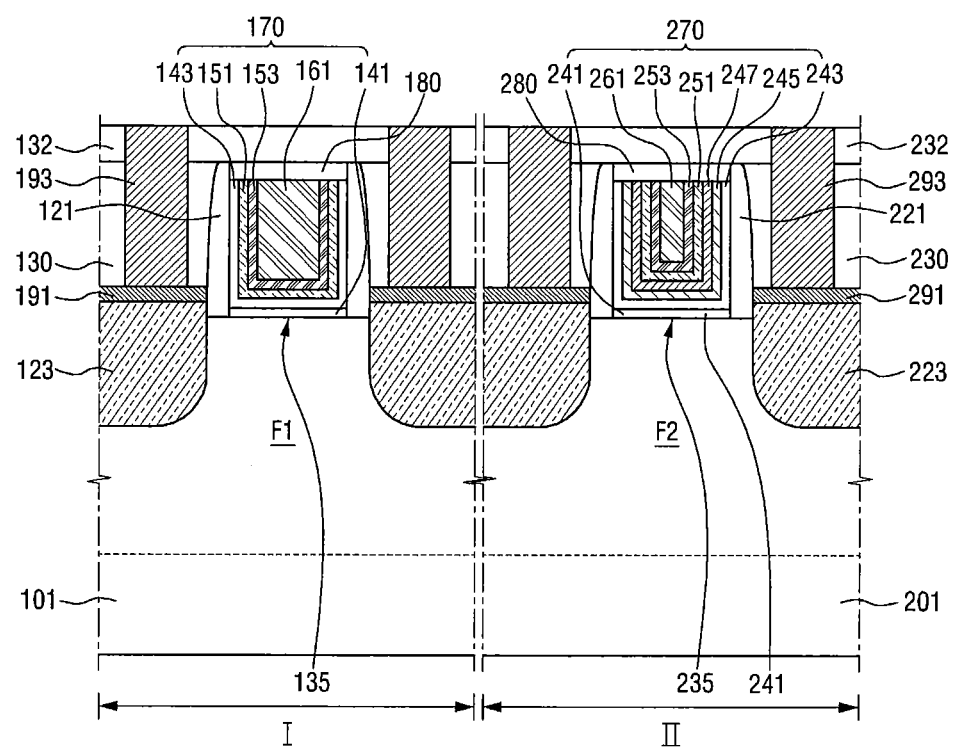
Figure 30:
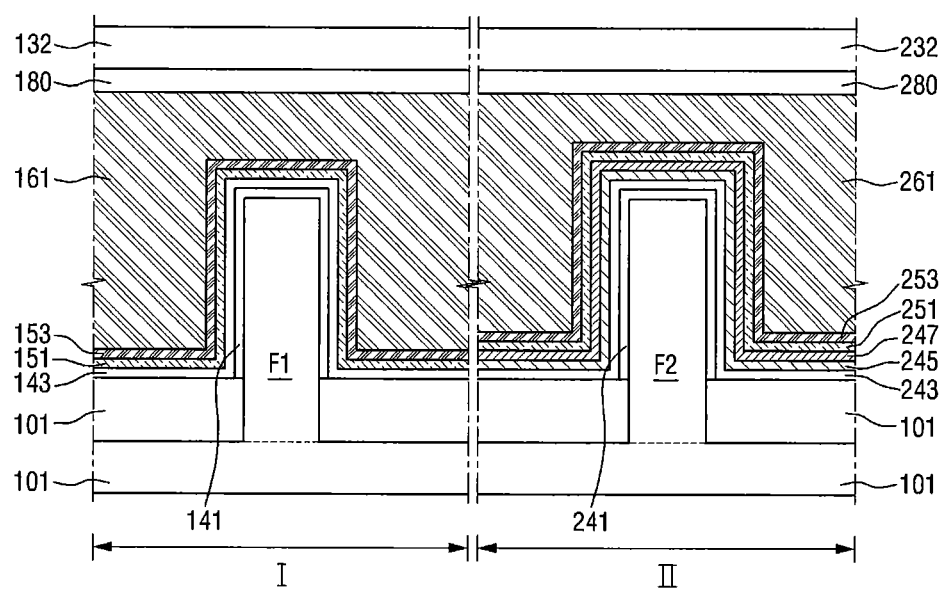

FIGS. 13 to 30 are diagrams illustrating intermediate process steps of a method for fabricating a semiconductor device (3) according to some embodiments of the present inventive concept. Specifically, FIGS. 13 to 16 and FIG. 28 are perspective views, FIGS. 17 to 27 are cross-sectional views taken along the lines A-A and B-B of FIG. 16, FIG. 29 is a cross-sectional view taken along the lines A-A and B-B of FIG. 28, and FIG. 30 is a cross-sectional view taken along the lines C-C and D-D of FIG. 28. It will be understood that, for easy description, first interlayer insulation films 130 and 230 and second interlayer insulation films 132 and 232 are not illustrated in FIG. 28.

Figure 13:
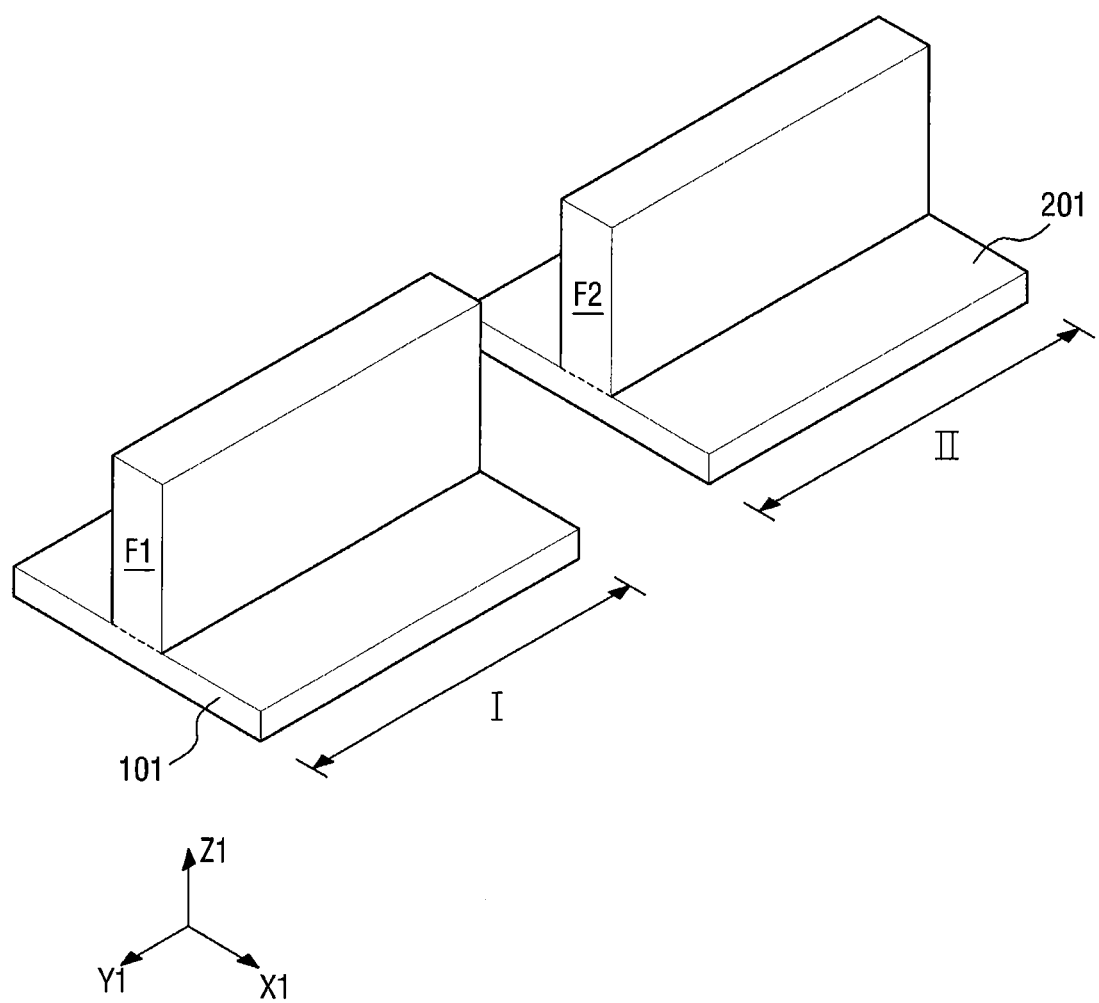
FIGS. 13 to 30 are diagrams illustrating intermediate process steps of a method for fabricating a semiconductor device according to some embodiments of the present inventive concept.

First, referring to FIG. 13, a first fin F1 and a second fin F2 are formed on substrates 101 and 201, respectively. A first region I and a second region II may be defined on the substrates 101 and 201. The first region I and the second region II may be spaced apart from each other or may be connected to each other. For example, the first region I may be an NMOS region where an N-type transistor is formed, and the second region II may be a PMOS region where a P-type transistor is formed, but aspects of the present inventive concept are not limited thereto.

The first fin F1 may be formed in the first region I and the second fin F2 may be formed in the second region II. The first and second fins F1 and F2 may protrude in a third direction Z1. The first and second fins F1 and F2 may extend in a second direction Y1 (e.g., a longitudinal direction the first and second fins F1 and F2), and each of the first and second fins F1 and F2 may have long sides extending in the second direction Y1 and short sides extending in a first direction X1, but aspects of the present inventive concept are not limited thereto. In some embodiments, the long side direction may extend in the first direction X1 and the short side direction may extend in the second direction Y1.

The first and second fins F1 and F2 may be portions of the substrates 101 and 201 and may include epitaxial layers grown from the substrates 101 and 201. For example, the first and second fins F1 and F2 may include Si or SiGe.

Figure 14:
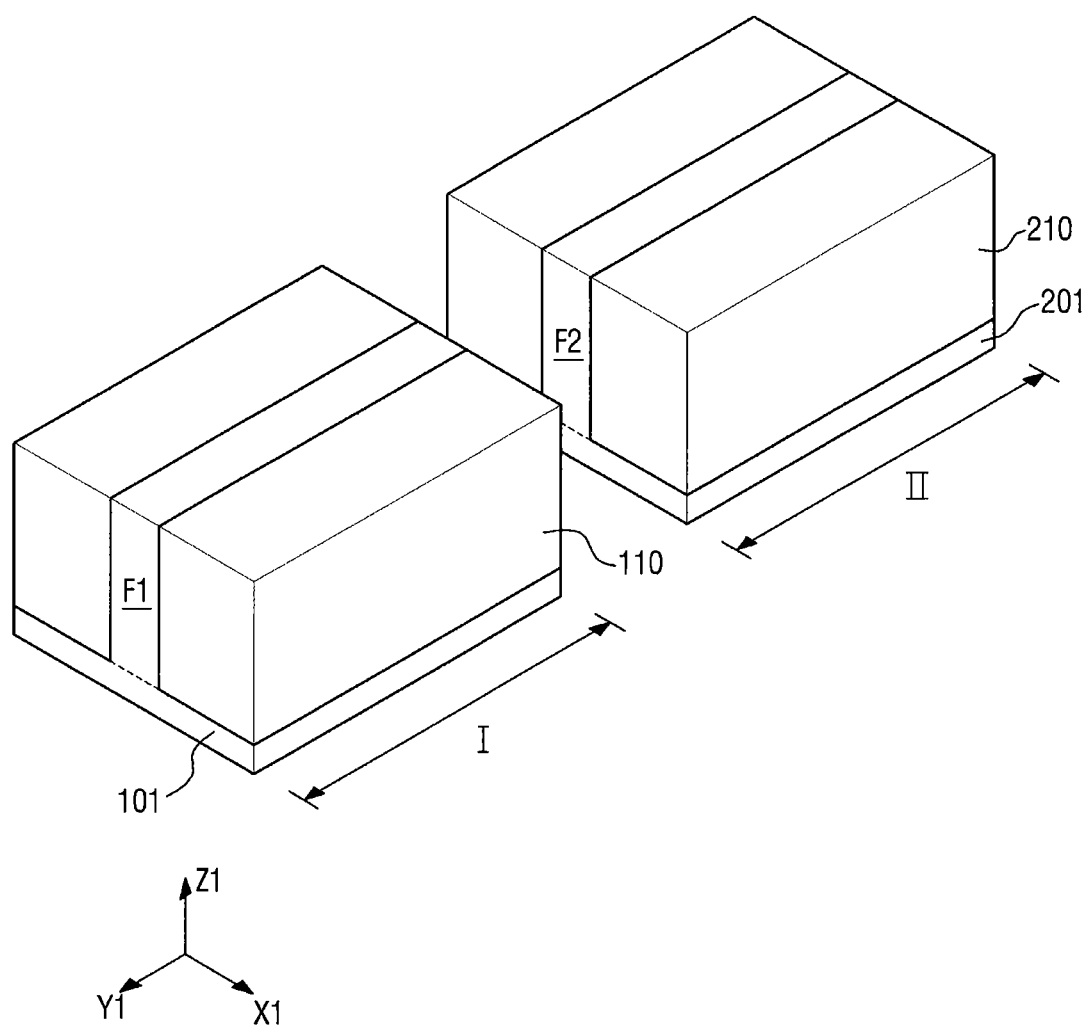

Referring to FIG. 14, field insulation layers 110 and 210 may be formed on the substrates 101 and 201 to cover sidewalls of the first and second fins F1 and F2. The field insulation layers 110 and 210 may include at least one of silicon oxide, silicon nitride and silicon oxynitride.

Figure 15:
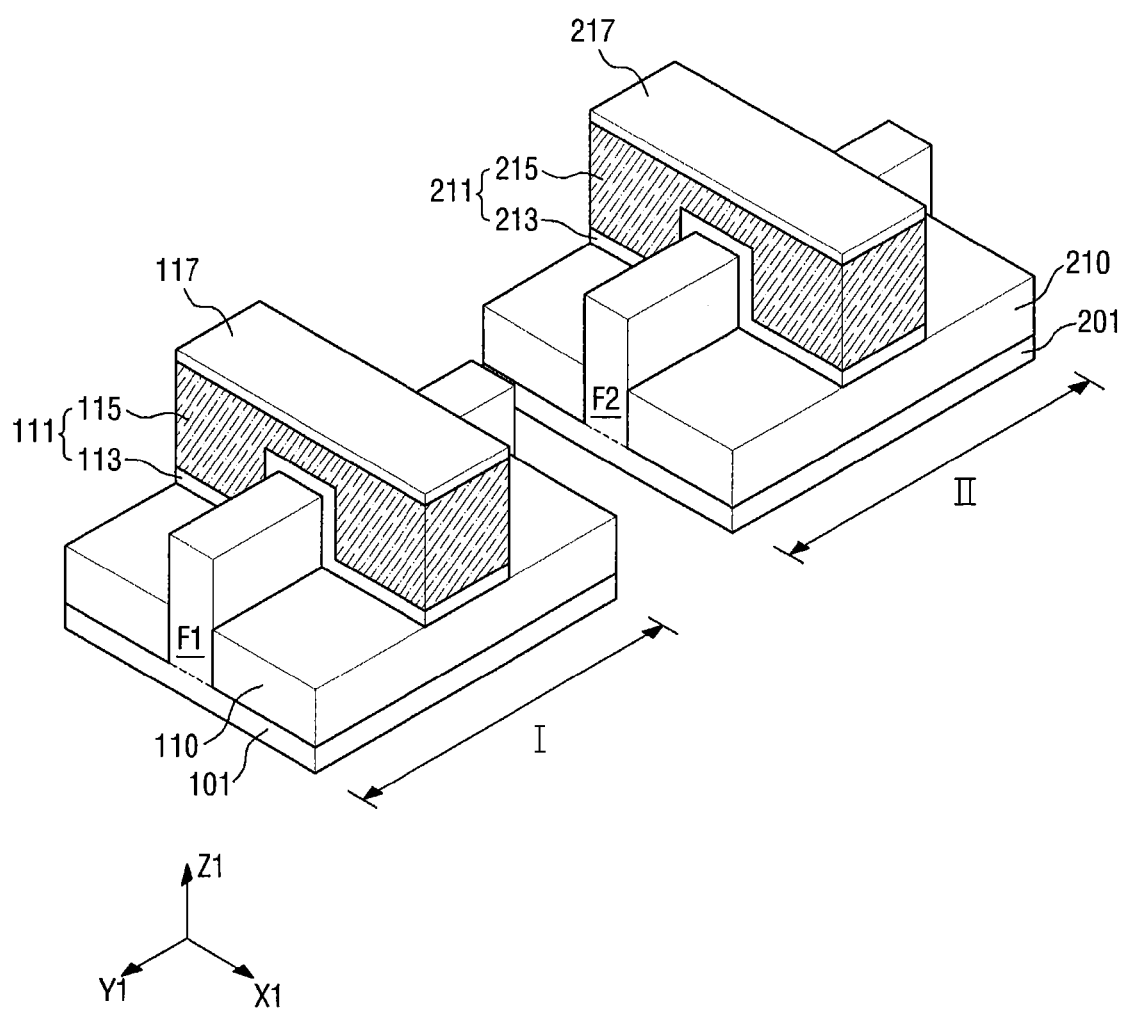
Figure 16:
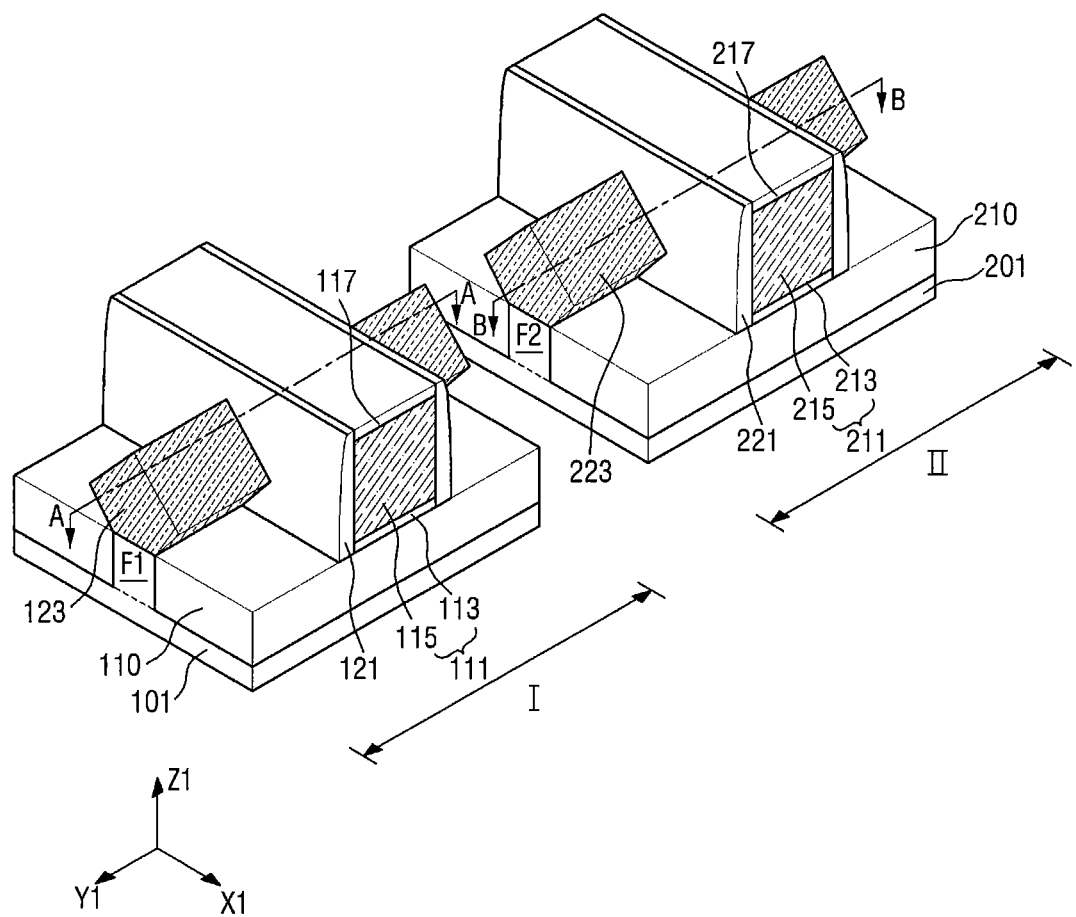

Referring to FIG. 15, top portions of the field insulation layers 110 and 210 may be recessed to expose top portions of the first and second fins F1 and F2. The recessing may be performed using, for example, a selective etching process.

The portions of the first and second fins F1 and F2 protruding above the field insulation layers 110 and 210 may be formed by an epitaxial process. For example, after the forming of the field insulation layers 110 and 210, the epitaxial process may be formed using the top surfaces of the first and second fins F1 and F2 exposed by the field insulation layers 110 and 210 as seed layers without the recessing, thereby forming the portions of the first and second fins F1 and F2.

In some embodiments, doping for adjusting threshold voltages may be performed on the exposed first and second fins F1 and F2. For example, the doping may be performed on the first fin F1 of the first region I using boron (B), and the doping may be performed on the second fin F2 of the second region II using phosphorus (P) or arsenic (As). First and second dummy gate structures 111 and 211 crossing the first and second fins F1 and F2 may be formed on the first and second fins F1 and F2, respectively. The first and second dummy gate structures 111 and 211 may extend in the first direction X1 and may cross the first and second fins F1 and F2 at a right angle as illustrated in FIG. 15, but aspects of the present inventive concept are not limited thereto. The first and second dummy gate structures 111 and 211 may cross the first and second fins F1 and F2 at an acute angle and/or an obtuse angle with respect to the first direction X1, respectively.

The first and second dummy gate structures 111 and 211 may include dummy gate insulation layers 113 and 213 and dummy gate electrodes 115 and 215, respectively. The dummy gate insulation layers 113 and 213 and the dummy gate electrodes 115 and 215 may be sequentially stacked.

The dummy gate insulation layers 113 and 213 may be conformally formed along top portions of the sidewalls and top surfaces of the exposed first and second fins F1 and F2 without being covered by the field insulation layers 110 and 210. In addition, the dummy gate insulation layers 113 and 213 may be positioned between the dummy gate electrodes 115 and 215 and the field insulation layers 110 and 210, respectively.

The dummy gate electrodes 115 and 215 may be formed on the dummy gate insulation layers 113 and 213.

For example, the dummy gate electrodes 115 and 215 may include silicon oxide and the dummy gate insulation layers 113 and 213 may include polysilicon.

The dummy hard mask layers 117 and 217 may be formed on the first and second dummy gate structures 111 and 211, respectively. The dummy hard mask layers 117 and 217 may include at least one of silicon oxide, silicon nitride, and silicon oxynitride.

Figure 17:
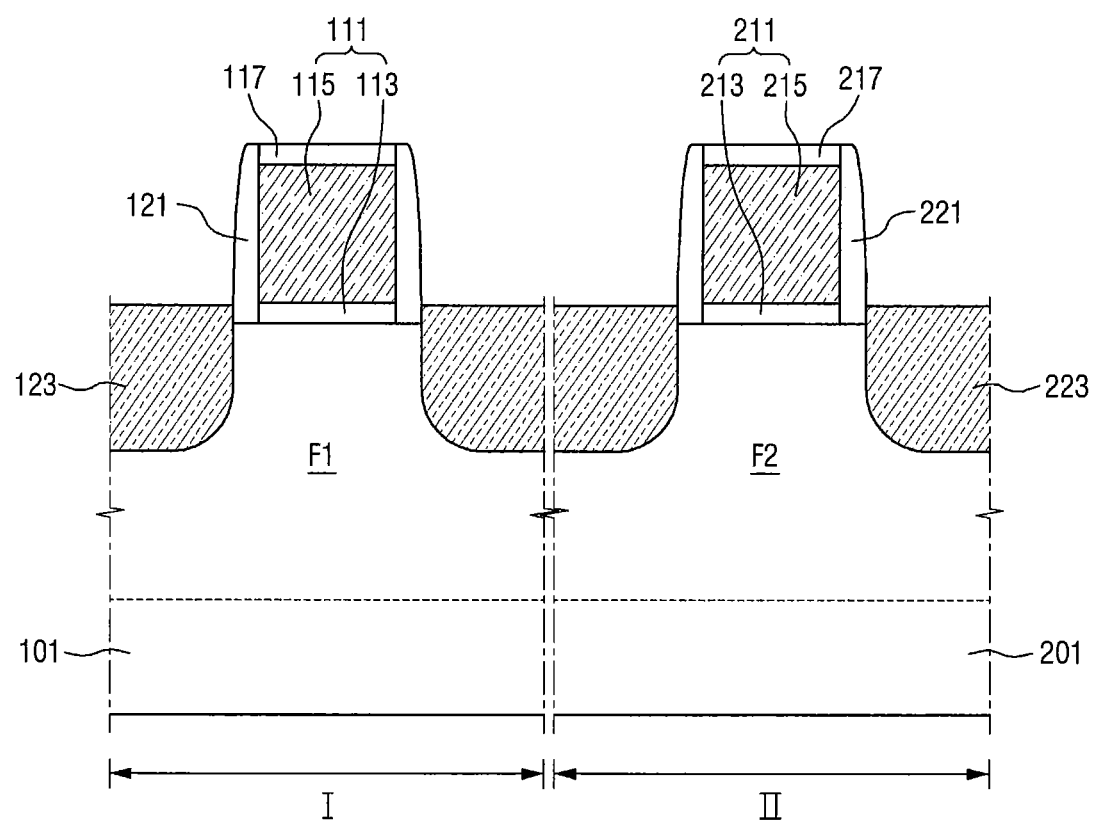

Referring to FIGS. 16 and 17, spacers 121 and 221 are formed on opposite sidewalls of the first and second dummy gate structures 111 and 211. The spacers 121 and 221 may expose top surfaces of the hard mask layers 117 and 217. The spacers 121 and 221 may include silicon nitride or silicon oxynitride.

Next, the first and second fins F1 and F2 not covered by the first and second dummy gate structures 111 and 211 may be etched. The first and second fins F1 and F2 may be etched using the spacers 121 and 221 and the first and second dummy gate structures 111 and 211 as etch masks.

Next, first and second source/drain regions 123 and 223 may be formed on the first and second fins F1 and F2. Specifically, the first source/drain region 123 may be formed on the first fin F1, and the second source/drain region 223 may be formed on the second fin F2. The first and second source/drain regions 123 and 223 may be elevated source/drain regions. As shown in FIG. 16, top surfaces of the first and second source/drain regions 123 and 223 may be higher than the top surfaces of the first and second fins F1 and F2.

The first source/drain region 123 of the first region I may include a tensile stress material. The first source/drain region 123 may include the same material as the substrate 101 or a tensile stress material. For example, when the substrate 101 includes Si, the first source/drain region 123 may include Si or a material having a smaller lattice constant than Si (e.g., SiC or SiP).

The second source/drain region 223 of the second region II may include a compressive stress material. For example, the compressive stress material may be a material having a larger lattice constant than silicon (Si), for example, SiGe. The compressive stress material may improve mobility of carriers of a channel region by applying the compressive stress to a portion of the second fin F2 positioned under the second dummy gate structure 211, the channel region.

The first and second source/drain regions 123 and 223 may be formed by a epitaxial growth process.

The first and second source/drain regions 123 and 223 may have a pentagonal shape as illustrated in FIG. 16, but aspects of the present inventive concept are not limited thereto. For example, the first and second source/drain regions 123 and 223 may have rectangular, circular or hexagonal shapes.

Figure 18:
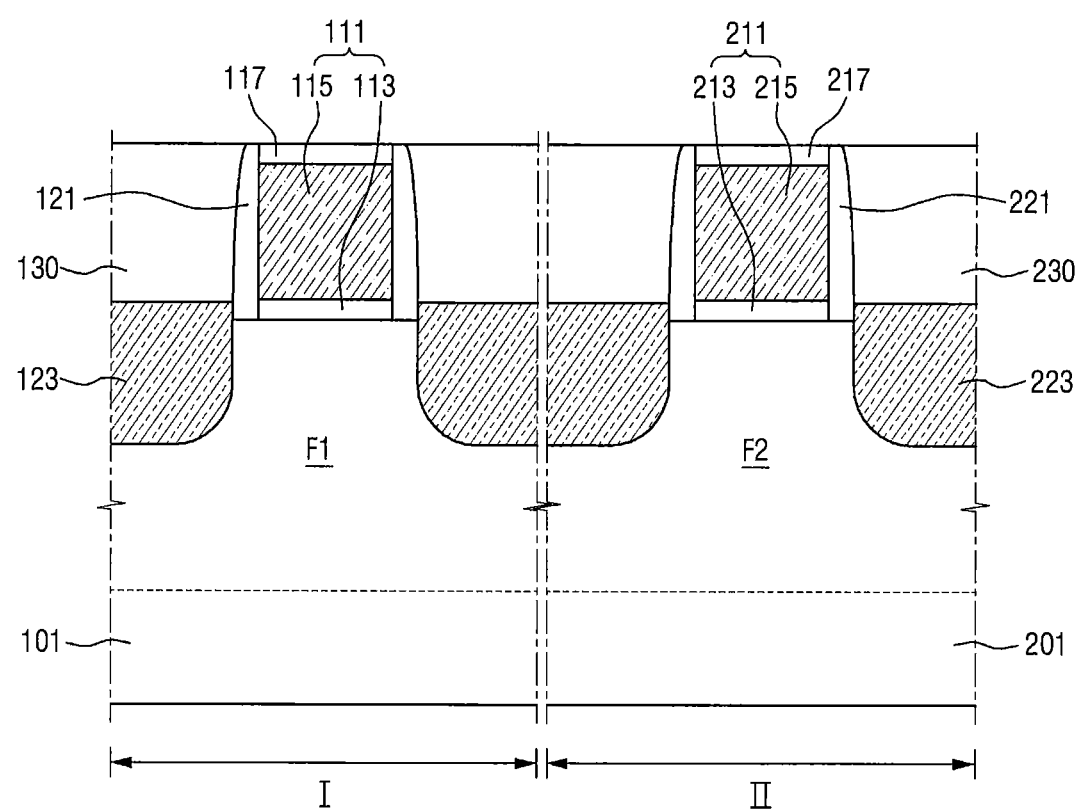

Referring to FIG. 18, first interlayer insulation films 130 and 230 covering the first and second source/drain regions 123 and 223 may be formed. The first interlayer insulation films 130 and 230 may cover the sidewalls of the spacers 121 and 221 while exposing the top surfaces of the hard mask layers 117 and 217. The first interlayer insulation films 130 and 230 may include, for example, silicon oxide.

Figure 19:
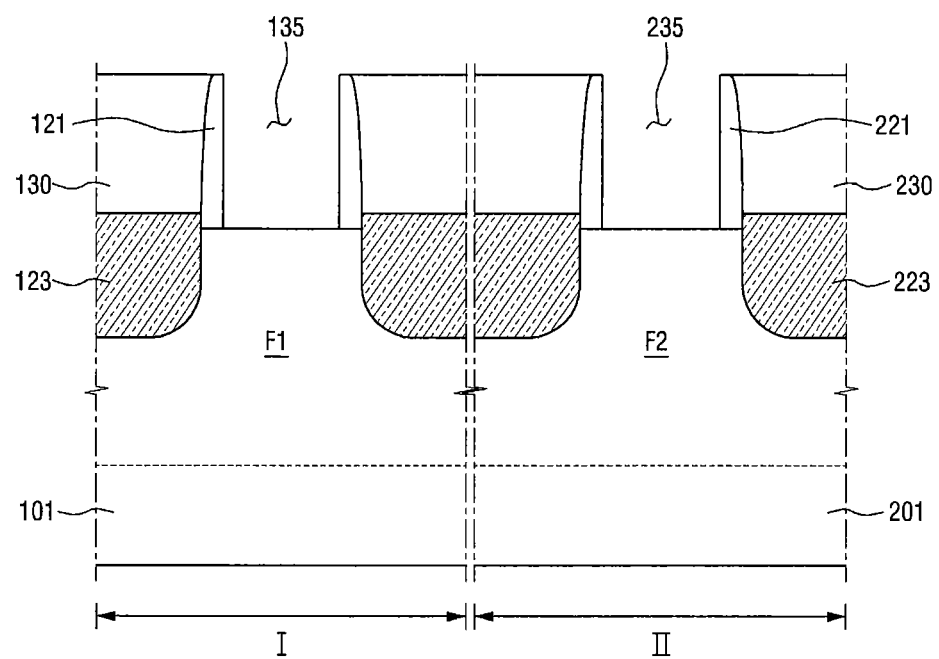

Referring to FIG. 19, first and second trenches 135 and 235 exposing top surfaces of the first and second fins F1 and F2 may be formed. First, the hard mask layers 117 and 217 are removed. For example, the hard mask layers 117 and 217 may be removed by a planarization process. As the result of the planarization process, the first interlayer insulation films 130 and 230 may also be partially etched.

Next, the first and second dummy gate structures 111 and 211 may be removed. The first and second fins F1 and F2 are exposed by removing the dummy gate electrodes 115 and 215 and the dummy gate insulation layers 113 and 213. The first trench 135 is formed at a location where the first dummy gate structure 111 was placed, and the second trench 235 is formed at a location where the second dummy gate structure 211 was placed. Sidewalls of the first and second spacers 121 and 221 may be exposed by the first and second trenches 135 and 235.

Figure 20:
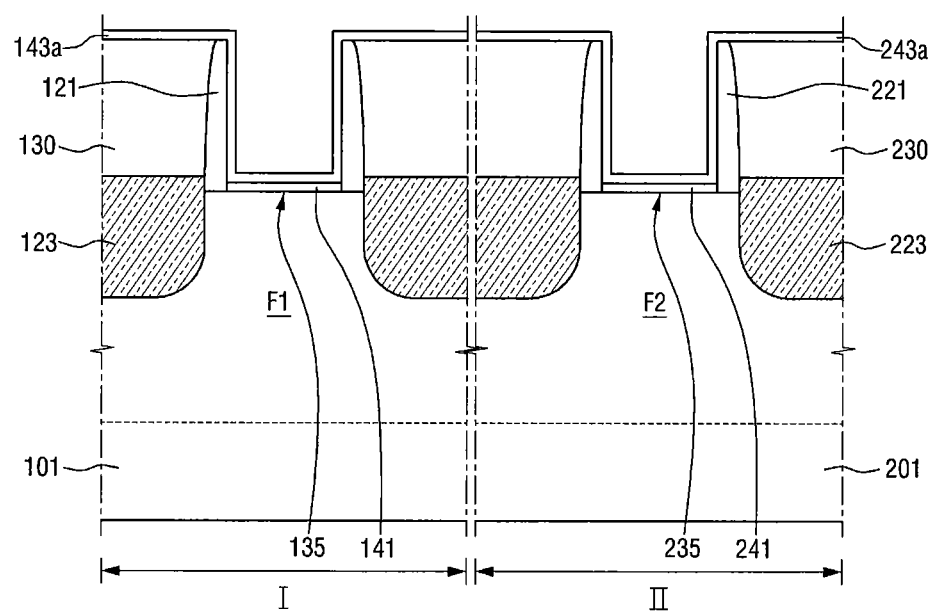

Referring to FIG. 20, first and second interface layers 141 and 241 may be formed in the first and second trenches 135 and 235. The first and second interface layers 141 and 241 may be formed along the top surfaces and top portions of the sidewalls of the first and second fins F1 and F2.

The first and second interface layers 141 and 241 may be formed by oxidizing the exposed first and second fins F1 and F2 in the first and second trenches 135 and 235, but aspects of the present inventive concept are not limited thereto. The first and second interface layers 141 and 241 may be formed along bottom surfaces of the first and second trenches 135 and 235, respectively. The first and second interface layers 141 and 241 may reduce interface failures between the first and second fins F1 and F2 and the first and second high-k layers 143a and 243a. The first and second interface layers 141 and 241 may include a low-k material layer having a dielectric constant (k) of 9 or less, e.g., a silicon oxide layer (dielectric constant k≈4) or a silicon oxynitride layer (dielectric constant k≈4~8 according to the concentration of oxygen and nitrogen atoms). Alternatively, the first and second interface layers 141 and 241 may include silicate or a combination of layers listed above.

Next, first and second high-k layers 143a and 243a may be formed in the first and second trenches 135 and 235. In detail, the first high-k layer 143a may be formed on sidewalls of the first trench 135. In other words, the first high-k layer 143a may be conformally along inner sidewalls and bottom surfaces of the first spacer 121. In addition, the first high-k layer 143a may be conformally formed along the field insulation layer 110, top portions of the sidewalls and top surface of the first fin F1. In addition, the second high-k layer 243a may be formed on sidewalls of the second trench 235. The second high-k layer 243a may be conformally along inner sidewalls and bottom surfaces of the second spacer 221. In addition, the second high-k layer 243a may be conformally along the field insulation layer 210, top portions of the sidewalls and top surfaces of the second fin F2. The first and second high-k layers 143a and 243a may also be formed on the first interlayer insulation films 130 and 230.

The first and second high-k layers 143a and 243a may include a high-k material having a higher dielectric constant than a silicon oxide layer. For example, the first and second high-k layers 143a and 243a may include a material selected from the group consisting of HfSiON, $HfO_2$, $ZrO_2$, $Ta_2O_5$, $TiO_2$, $SrTiO_3$ and $(Ba,Sr)TiO_3$. The first and second high-k layers 143a and 243a may have appropriate thicknesses according to the kinds of devices to be formed.

Figure 21:
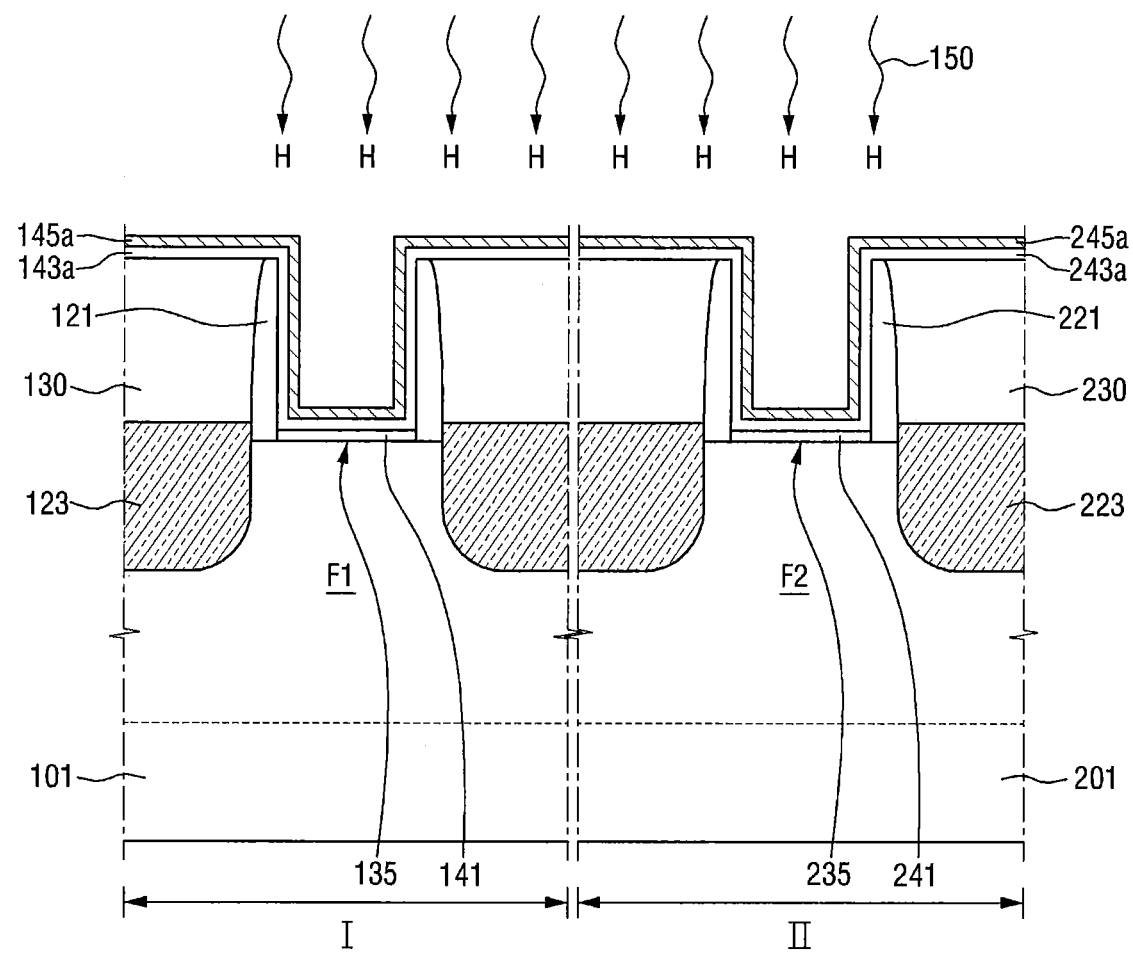

Referring to FIG. 21, first work function control films 145a and 245a may be formed on the high-k layers 143a and 243a. The first work function control films 145a and 245a may be conformally formed on the high-k layers 143a and 243a along the high-k layers 143a and 243a. For example, the first work function control films 145a and 245a may be P-type work function control films. The first work function control films 145a and 245a may be formed along inner sidewalls and bottom surfaces of the first and second trenches 135 and 235. In addition, the first work function control films 145a and 245a may be conformally formed along top portions of the sidewalls and top surfaces of the first and second fins F1 and F2.

The first work function control films 145a and 245a may include, for example, at least one nitride layer made of TiN, TaN, TiAlN, TaAlN, or TiSiN.

The first work function control films 145a and 245a may include impurities. The impurities may include first impurities and second impurities. The first impurities may be oxygen (O) and the second impurities may be chlorine (Cl). It will be understood that, in the course of forming the first work function control films 145a and 245a, the first work function control films 145a and 245a may be oxidized. Pre-oxidized first work function control films 145a and 245a may be formed on the high-k layers 143a and 243a. In addition, a processing chamber may be provided with the stream of chlorine (Cl), which may penetrate into the first work function control films 145a and 245a in the course of forming the first work function control films 145a and 245a. In such a manner, the first work function control films 145a and 245a may include impurities, which may affect a work function of a gate structure (270 of FIG. 28).

Still referring to FIG. 21, the impurities may be removed from the first work function control films 145a and 245a. For example, hydrogen plasma 150 (e.g., hydrogen ions) may be doped into the first work function control films 145a and 245a. In order to efficiently perform the doping of the hydrogen plasma (150), a voltage of about 0.1 kV to about 2 kV may be applied to the substrates 101 and 201, and the hydrogen plasma may be doped (150) at a process pressure of about 5 to about 100 mTorr.

For example, the hydrogen plasma may be bonded with the first impurity to form $H_2O$ and may be bonded with the second impurity to form HCl. As described above, the hydrogen plasma may react with the impurities so as to remove the impurities from the first work function control films 145a and 245a.

The concentration of the first impurity contained in the first work function control films 145a and 245a may be reduced by greater than 0% and up to about 90% by the doping of the hydrogen plasma (150), and the concentration of the second impurity contained in the first work function control films 145a and 245a may be reduced by greater than 0% and up to about 80%.

Figure 22:
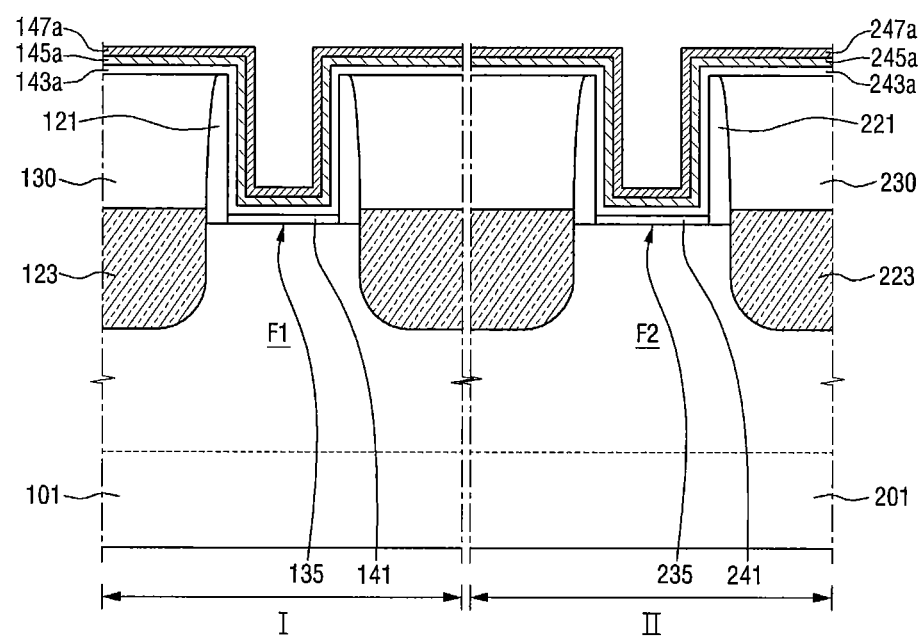

Referring to FIG. 22, first barrier layers 147a and 247a may be conformally formed on the first work function control films 145a and 245a along the first work function control films 145a and 245a. In detail, the first barrier layers 147a and 247a may be conformally formed along inner sidewalls and bottom surfaces of the first and second trenches 135 and 235. In addition, the first barrier layers 147a and 247a may be conformally formed along top portions of sidewalls and top surfaces of the first and second fins F1 and F2, respectively.

After the doping of the hydrogen plasma (150), the first barrier layers 147a and 247a may be formed, thereby possibly preventing the impurities from penetrating into the first work function control films 145a and 245a.

The first barrier layers 147a and 247a may include, for example, at least one of TiN, TaN, TiAlN, TaAlN, TaAlN and TiSiN.

Figure 23:
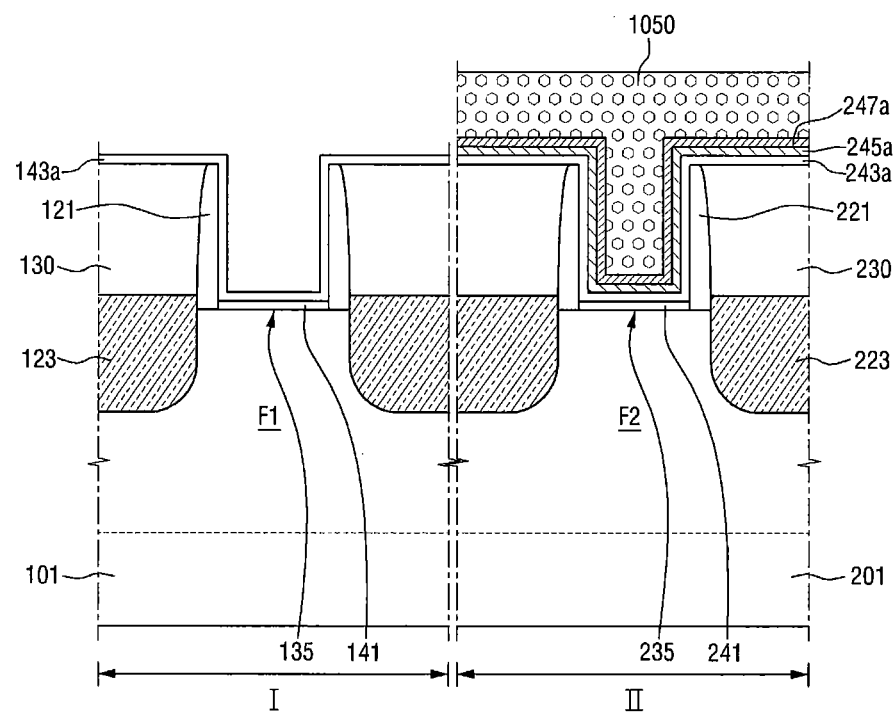

Referring to FIG. 23, a mask 1050 may be formed on the first barrier layer 247a of the second region II. The mask 1050 may cover the second trench 235 while exposing the first trench 135.

Next, the first barrier layer 147a and the first work function control film 145a in the first region I may be removed using the mask 1050. Accordingly, the first high-k layer 143a may be exposed.

Next, after the removing of the first barrier layer 147a and the first work function control film 145a in the first region I, the mask 1050 in the second region II may be removed.

Figure 24:
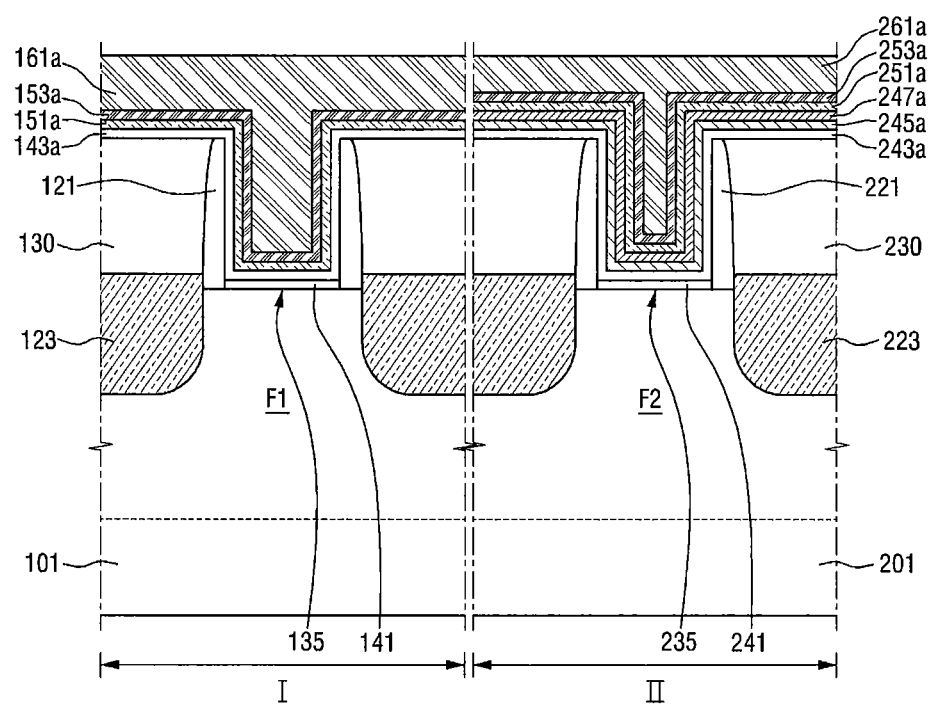

Referring to FIG. 24, second work function control films 151a and 251a may be sequentially formed on the first region I and the second region II. The second work function control films 151a and 251a may be conformally formed along inner sidewalls and bottom surfaces of the first and second trenches 135 and 235. In addition, the second work function control films 151a and 251a may be conformally formed along top portions of the sidewalls and top surfaces of the first and second fins F1 and F2. The second work function control film 151a may be formed on the high-k layer 143a in the first region I, and the second work function control film 251a may be formed on the first barrier layer 247a in the second region II.

The second work function control films 151a and 251a may be N-type work function control films and may include, for example, at least one of TiAlC, TiAlN, TiAlC—N, TiAl, TaC and TiC.

The second work function control film 251a may be stacked on the first work function control film 245a in the second region II, so that two work function control films may be disposed in the second region II. The underlying first work function control film 245a may control a work function of a transistor, thereby controlling operating characteristics of the transistor. Therefore, the transistor of the second region II may function as a P-type transistor. A transistor of the first region I may function as an N-type transistor by the second work function control film 151a.

Next, second barrier layers 153a and 253a may be conformally formed on the second work function control films 151a and 251a and along the second work function control films 151a and 251a. The second work function control films 153a and 253a may be formed along the sidewalls and bottom surfaces of the first and second trenches 135 and 235. In addition, the second barrier layers 153a and 253a may be formed along top portions of the sidewalls and top surfaces of the first and second fins F1 and F2.

The second barrier layers 153a and 253a may include, for example, at least one of TiN, TaN, TiAlN, TaAlN, TaAlN, and TiSiN.

Next, gate metals 161a and 261a may be formed on the second barrier layers 153a and 253a. The gate metals 161a and 261a may be formed in the first and second trenches 135 and 235. In some embodiments, the gate metals 161a and 261a may fill the first and second trenches 135 and 235.

The gate metals 161a and 261a may include, for example, Al or W.

Figure 25:
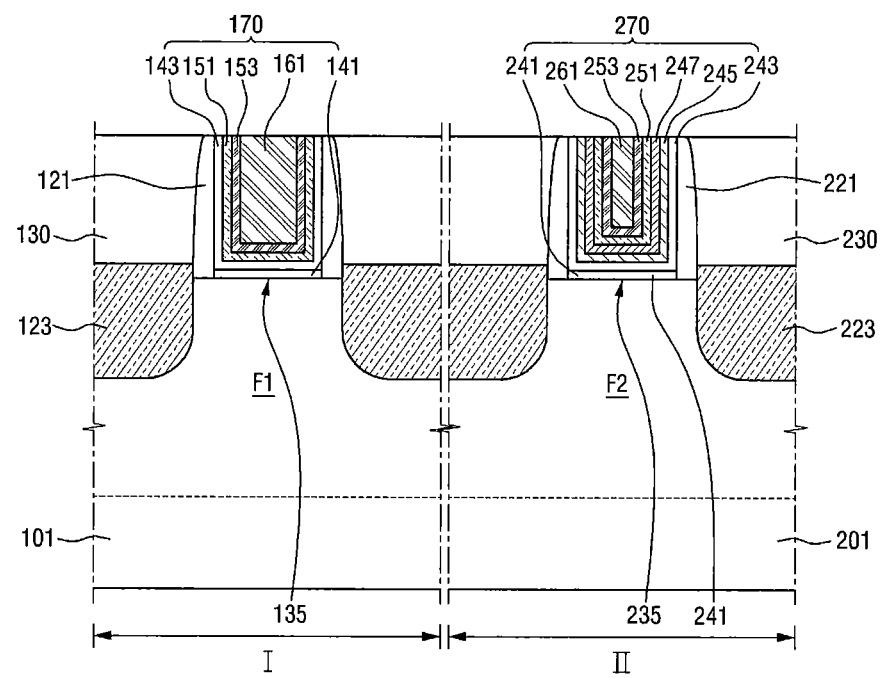

Referring to FIG. 25, first and second gate structures 170 and 270 may be formed. A planarization process may be performed on the resultant product of FIG. 26 to expose the first interlayer insulation films 130 and, thereby forming a first gate structure 170 in the first region I and a second gate structure 270 in the second region II, respectively. The first gate structure 170 may include a first interface layer 141, a high-k layer 143, a second work function control film 151, a second barrier layer 153 and a gate metal 161. The second gate structure 270 may include a second interface layer 241, a high-k layer 243, a first work function control film 245, a first barrier layer 247, a second work function control film 251, a second barrier layer 253 and a gate metal 261. The high-k layers 143 and 243, the first work function control film 245, the first barrier layer 247, the second work function control films 151 and 251, and the second barrier layers 153 and 253 may be formed in the first and second trenches 135 and 235.

Figure 26:
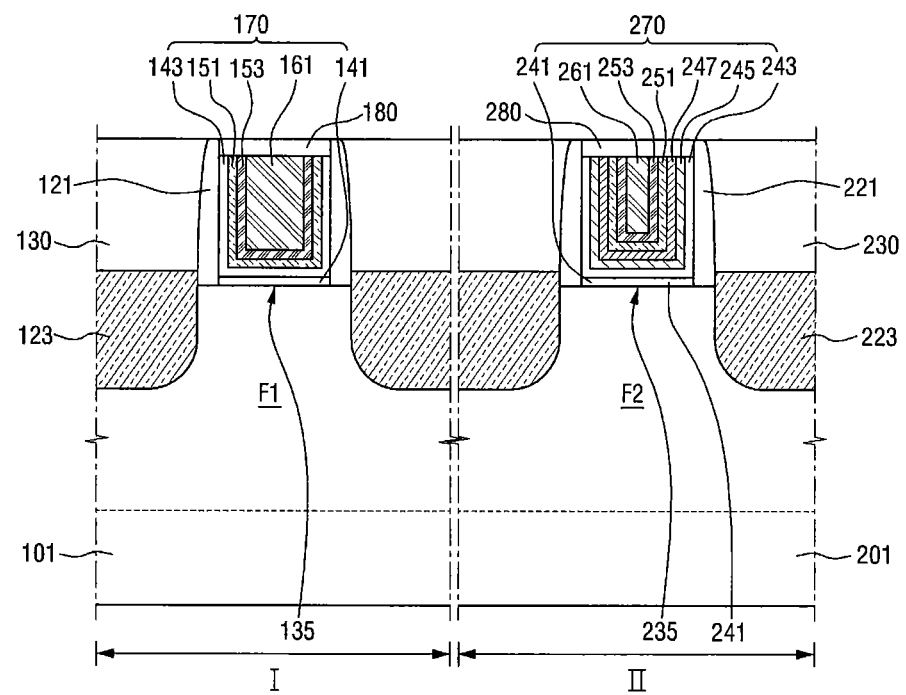

Referring to FIG. 26, first and second capping layers 180 and 280 may be formed on the first and second gate structures 170 and 270, respectively. The first and second capping layers 180 and 280 may cover the first and second trenches 135 and 235.

The first and second capping layers 180 and 280 may include a nitride layer (for example, at least one of SiN, SiON and SiCON) or an oxide layer.

The first and second capping layers 180 and 280 may protect the first and second gate structures 170 and 270 so as to reduce or possibly avoid a change in performance of the first and second gate structures 170 and 270. For example, the first and second capping layers 180 and 280 may be formed on the first work function control film 245 so as not to be exposed and the impurities may not penetrate into the first work function control film 245.

Meanwhile, before forming the first and second capping layers 180 and 280, portions of the first and second gate structures 170 and 270 may be removed to adjust heights of the first and second gate structures 170 and 270. Therefore, the high-k layers 143 and 243, the first work function control film 245, the first barrier layer 247, the second work function control films 151 and 251, the second barrier layers 153 and 253 and the gate metals 161 and 261 may be partially removed. In this case, sidewalls of the first and second capping layers 180 and 280 may be brought into contact with sidewalls of the spacers 121 and 221. In addition, top surfaces of the first and second capping layers 180 and 280 may be coplanar with the first interlayer insulation films 130 and 230.

Threshold voltages of the first and second gate structures 170 and 270 may be adjusted by adjusting the heights of the first and second gate structures 170 and 270.

Figure 27:
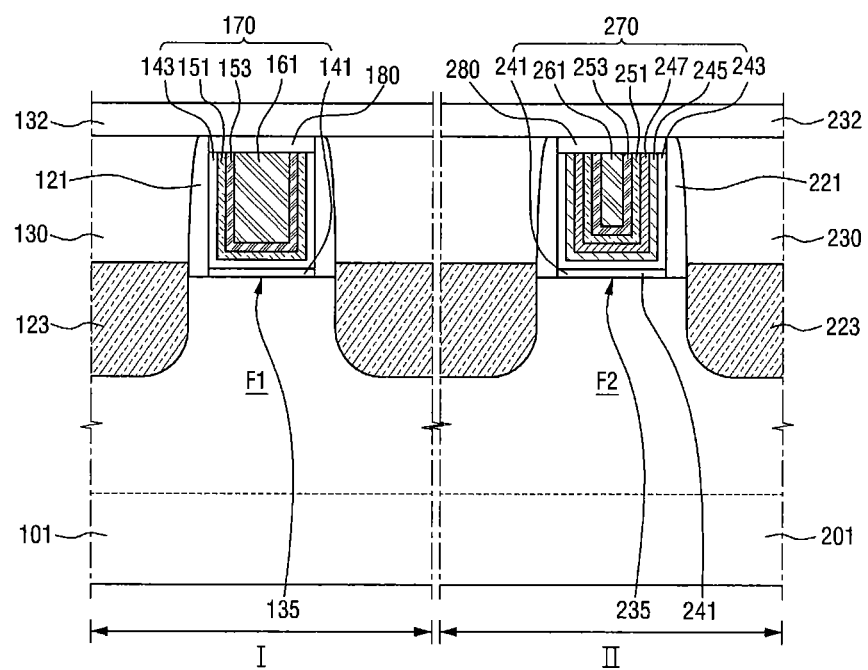

Referring to FIG. 27, second interlayer insulation films 132 and 232 are formed on the first interlayer insulation films 130 and 230. The second interlayer insulation films 132 and 232 may cover the first and second capping layers 180 and 280. The second interlayer insulation films 132 and 232 may include the same material as the first interlayer insulation films 130 and 230, for example, silicon oxide.

Referring to FIGS. 28 to 30, holes may be formed. The holes may pass through the first and second interlayer insulation films 130, 230, 132 and 232 and may expose the first and second source/drain regions 123 and 223. First and second silicide layers 191 and 291 may be formed on the first and second source/drain regions 123 and 223, respectively, in the semiconductor device 3. Next, first and second contacts 193 and 293 may be formed on the first and second silicide layers 191 and 291. The first and second contacts 193 and 293 may pass through the first interlayer insulation films 130 and 230 and the second interlayer insulation films 132 and 232, respectively. The first and second silicide layers 191 and 291 may reduce surface resistance and contact resistance of the first and second source/drain regions 123 and 223, and may include, for example, Pt, Ni or Co. The first and second contacts 193 and 293 may include, for example, W, Al or Cu.

Figure 31:
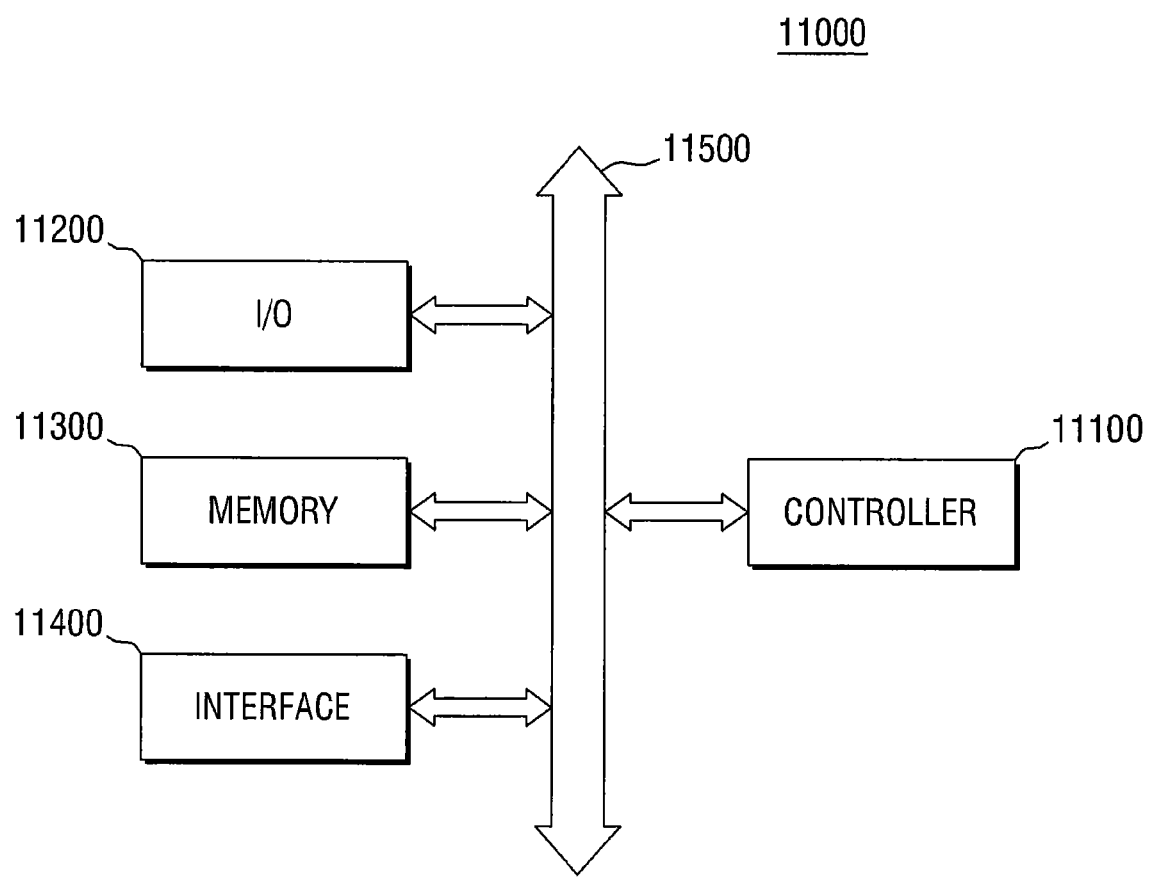
FIG. 31 is a block diagram of an electronic system including semiconductor devices fabricated by fabricating methods of according to some embodiments of the present inventive concept.

FIG. 31 is a block diagram of an electronic system including semiconductor devices according to some embodiments of the present inventive concept.

Referring to FIG. 31, the electronic system 11000 may include a controller 11100, an input/output device (I/O) 11200, a memory 11300, an interface 11400 and a bus 11500. The controller 11100, the I/O 11200, the memory 11300, and/or the interface 11400 may be connected to each other through the bus 11500. The bus 11500 corresponds to a path through which data moves.

The controller 11100 may include at least one of a microprocessor, a digital signal processor, a microcontroller, and logic elements capable of functions similar to those of these elements. The I/O 11200 may include a keypad, a keyboard, a display device, and so on. The memory 11300 may store data and/or commands. The interface 11400 may perform functions of transmitting data to a communication network or receiving data from the communication network. The interface 11400 may be wired or wireless. For example, the interface 11400 may include an antenna or a wired/wireless transceiver, and so on. In some embodiments, the electronic system 11000 may further include high-speed DRAM and/or SRAM as the working memory for improving the operation of the controller 11100. The semiconductor devices according to some embodiments of the present inventive concept may be provided in the memory 11300 or may be provided in some components of the controller 11100 or the I/O 11200.

The electronic system 11000 can be applied to a variety of different types of devices, such as personal digital assistants (PDAs), portable computers, web tablets, wireless phones, mobile phones, digital music players, memory cards, or all electronic products capable of transmitting/receiving information in wireless environments.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method for fabricating a semiconductor device, the method comprising:
    forming a first interlayer insulation film including a trench on a substrate;
    forming a high-k layer along an inner sidewall and a bottom surface of the trench;
    forming a first work function control film along the high-k layer, the first work function control film including impurities;
    at least partially removing the impurities from the first work function control film to reduce surface resistance of the first work function control film by about 30% to about 60%; and
    forming a gate metal in the trench.

2. The method of claim 1, wherein removing the impurities comprises removing the impurities by doping hydrogen into the first work function control film using hydrogen plasma.

3. The method of claim 2, wherein the impurities include oxygen (O).

4. The method of claim 3, wherein the first work function control film includes a material having lower electronegativity than the impurities.

5. The method of claim 2, wherein a concentration of the impurities in the first work function control film is reduced by up to about 90% by doping hydrogen into the first work function control film.

6. The method of claim 2, wherein the impurities include first impurities and second impurities different from the first impurities, and a concentration of the second impurities in the first work function control film is reduced by up to about 80% by doping hydrogen into the first work function control film.

7. The method of claim 6, wherein the first impurities includes oxygen (O) and the second impurities includes chlorine (Cl).

8. The method of claim 2, wherein doping hydrogen into the first work function control film comprises doping hydrogen at a pressure of about 5 to about 100 mTorr.

9. The method of claim 2, wherein doping hydrogen into the first work function control film comprises doping hydrogen by applying a voltage of about 0.1 kV to about 2 kV to the substrate.

10. The method of claim 1, further comprising forming a first barrier layer along the first work function control film, after removing the impurities.

11. The method of claim 1, further comprising forming a capping layer on the trench, after forming the gate metal.

12. The method of claim 11, further comprising forming a second interlayer insulation film on the capping layer after forming the capping layer, wherein the capping layer is between the first work function control film and the second interlayer insulation film such that the first work function control film does not contact the second interlayer insulation film.

13. The method of claim 1, further comprising forming a second work function control film different from the first work function control film along the first work function control film, before forming the gate metal.

14. A method for forming a semiconductor device, the method comprising:
   forming a gate insulating layer on a substrate;
   forming a work function control film comprising impurities on the gate insulating layer; and
   doping hydrogen into the work function control film using a hydrogen plasma doping process to remove at least a portion of the impurities from the work function control film.

15. The method of claim 14, wherein the hydrogen plasma doping process removes up to about 90% of the impurities from the work function control film.

16. The method of claim 15, wherein the impurities comprises oxygen (O).

17. The method of claim 15, wherein the work function control film comprises a material having lower electronegativity than the impurities.

18. The method of claim 14, wherein:
   the impurities comprises first impurities and second impurities that are different from the first impurities; and
   the hydrogen plasma doping process removes up to about 90% of the first impurities from the work function control film and removes up to about 80% of the second impurities from the work function control film.

19. The method of claim 18, wherein the first impurities comprise oxygen (O) and the second impurities comprise chlorine (Cl).

20. The method of claim 14, wherein the hydrogen plasma doping process is performed at a pressure of about 5 mTorr to about 100 mTorr and by applying a voltage of about 0.1 kV to about 2 kV to the substrate.

* * * * *